(12) United States Patent
Takahashi

(10) Patent No.: US 6,472,840 B1
(45) Date of Patent: Oct. 29, 2002

(54) VIBRATION CANCELLATION APPARATUS AND EXPOSURE APPARATUS

(75) Inventor: Masato Takahashi, Kumagaya (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/684,809

(22) Filed: Oct. 10, 2000

Related U.S. Application Data

(63) Continuation of application No. PCT/JP99/01886, filed on Apr. 9, 1999.

(30) Foreign Application Priority Data

Apr. 9, 1998 (JP) .......................... 10-097595

(51) Int. Cl.⁷ .................... F16M 13/00; H01L 21/68
(52) U.S. Cl. .................... 318/649; 318/623; 318/611
(58) Field of Search ................... 318/460, 575, 318/611, 623, 649; 248/550

(56) References Cited

U.S. PATENT DOCUMENTS

| | | | | |
|---|---|---|---|---|
| 4,635,892 A | * | 1/1987 | Baker | 248/550 |
| 4,819,182 A | * | 4/1989 | King et al. | 364/508 |
| 5,251,863 A | * | 10/1993 | Gossman et al. | 248/550 |
| 5,323,466 A | * | 6/1994 | Geddes | 381/71 |
| 5,369,348 A | * | 11/1994 | Gennesseaux | 318/623 |
| 5,374,025 A | * | 12/1994 | Whelpley et al. | 248/550 |
| 6,009,985 A | * | 1/2000 | Ivers | 188/380 |

FOREIGN PATENT DOCUMENTS

| | | |
|---|---|---|
| JP | 62-219635 A | 9/1987 |
| JP | 1-111683 A | 4/1989 |
| JP | 5-106682 | 4/1993 |
| JP | 6-33638 | 2/1994 |
| JP | 6-58014 | 3/1994 |
| JP | 8-148412 | 6/1996 |
| JP | 9-199402 | 7/1997 |

* cited by examiner

*Primary Examiner*—Bentsu Ro
(74) *Attorney, Agent, or Firm*—Oliff & Berridge, PLC

(57) ABSTRACT

When a drive unit which drives a reticle stage accelerates or decelerates it, the reaction experienced by this drive unit is discharged to a floor FD via an actuator, an attached member, and a reaction frame. Vibration generated in the reaction frame at this time is detected by an acceleration sensor. A vibration cancellation control section determines a direction and thrust for driving a movable section to which a weight is fixed in order to quell vibration of the reaction frame detected by the acceleration sensor, and emits a control signal to a driver.

25 Claims, 16 Drawing Sheets

REACTION ACTING ON REACTION FRAME DURING STAGE ACCELERATION AND DECELERATION

MOVEMENT OF MOVABLE BODY

WITH VIBRATION CONTROL

WITHOUT VIBRATION CONTROL

VIBRATION CANCELLATION APPARATUS AND EXPOSURE APPARATUS

This application is a continuation of PCT International application No. PCT/JP99/01886 filed Apr. 9,1999.

INCORPORATION BY REFERENCE

The present application is based upon the one identified below, and the contents thereof are incorporated herein by reference:

Japanese Patent Application Heisei 10 No. 97595 (filed upon April 9th, Heisei 10).

BACKGROUND OF THE INVENTION

1. Field of the Invention

The present invention relates to a vibration cancellation apparatus and to an exposure apparatus, and more particularly relates to a vibration cancellation apparatus and to an exposure apparatus which, based upon vibration which is detected, reduce the above-described vibration by driving a weight in a direction to quell it.

2. Related Art

In accompaniment with enhancement of the accuracy of precision equipment such as step-and-repeat type and step-and-scan and-scan type exposure apparatus and the like, the requirement has arisen for isolating minute vibrations at the micro-G level which act upon a base table (a vibration cancellation table) from the surface of a foundation floor on which a precision equipment is set. For this reason, there have been many proposals to support the vibration cancellation table by vibration cancellation pads, so as to isolate vibrations from the surface of the foundation floor. Various types of vibration cancellation pads have been used to support the vibration cancellation tables of vibration cancellation apparatus, such as mechanical dampers containing compression coil springs in damping fluid and air type dampers or the like. In particular, air spring vibration cancellation apparatus equipped with air type dampers are widely used for supporting precision equipment, because it is possible to set the spring constant low so as to isolate vibrations above about 10 Hz. Further, active vibration cancellation apparatus have recently been proposed in order to defeat the limitations of prior art passive vibration cancellation apparatus (for example, refer to Japanese Patent Laying Open Publication Heisei 8-166043 filed by the same applicant as the present application). These are vibration cancellation apparatus which perform vibration control by detecting vibration of the vibration cancellation table by a sensor and by driving an actuator based upon the output of this sensor, and theoretically they are endowed with a vibration isolation efficacy which exhibits no resonant peaks in the low frequency control band.

The use of a reaction frame has been practiced as one means for yet further enhancement of the vibration cancellation performance of the above-described active vibration cancellation apparatus. Such a reaction frame will now be explained. A mask stage or a substrate stage is set up upon the vibration cancellation table of the above-explained exposure apparatus. During exposure action, in accompaniment with repeated acceleration and deceleration of the mask stage or the substrate stage (hereinafter termed the moving stage), vibration increasing forces act upon the vibration cancellation table due to reactions received from the moving stage. An element used for preventing this vibration increasing forces from acting upon the vibration cancellation table is a reaction frame.

That is, the reaction frame is fixedly provided upon the surface of the foundation floor on which the exposure apparatus is installed, and this reaction frame receives the reactions which accompany acceleration and deceleration of the moving stage. Accordingly, the above-described reactions which are transmitted to the reaction frame are not transmitted to the vibration cancellation table, but are transmitted to the surface of the foundation floor. By doing this, it is possible to prevent vibration of the vibration cancellation table in accompaniment with acceleration and deceleration of the moving stage.

Further, with the above described exposure apparatus, it has been proposed to set up the illumination optical system and the exposure apparatus main body as separate units (for example, in Japanese Patent Application Heisei 9-310438 filed by the same applicant as the present application). Such an arrangement is for preventing vibration generated during the scanning exposure action of a step-and-scan exposure apparatus when the reticle blind which intercepts light outside the exposure range upon the reticle pattern moves synchronously with scanning exposure from being transmitted to the exposure apparatus main body. With the above described step-and-scan exposure apparatus, the exposure apparatus main body and the illumination optical system are mutually separately provided and each of them is supported by an active vibration cancellation apparatus, and vibration cancellation action is performed independently for each of them while their relative position is maintained. By doing this, along with it being possible to prevent vibration generated as described above in the illumination optical system from being transmitted to the exposure apparatus main body, it is also possible to maintain the accuracy of relative position determination between the illumination optical system and the exposure apparatus main body, as is desirable.

However, along with the increase in accuracy of position determination of the moving stage which is being required, it has become impossible to ignore vibration set up in the reaction frame itself. That is to say, the reaction frame receives the reactions generated accompanying acceleration and deceleration of the moving stage. Vibration is set up in the reaction frame when it experiences these reactions. And vibration of the reaction frame is transmitted through the surface of the foundation floor on which the exposure apparatus is installed to the exposure apparatus main body.

As an accuracy of position determination of the moving stage becomes high, it has become impossible to ignore vibration transmitted to the exposure apparatus main body.

Further, with an apparatus in which the illumination optical system and the exposure apparatus main body are set up as separate units, there have been demands for further suppression of vibration generated within the illumination optical system, in order to enhance the performance of position determination of the illumination optical system and the exposure apparatus. The reason for this is that vibration generated within the illumination optical system is also transmitted to the exposure apparatus main body via the surface of the foundation floor as well.

Yet further, when a stage or the like operates within the exposure apparatus main body, it may happen that residual vibration which has not been eliminated by the reaction frame generates undesirable vibration in the projection optical system. When this happens, exposure action cannot be performed until the vibration of the projection optical system has been abated to a specified level, and sometimes this leads to deterioration of the throughput of the exposure apparatus.

The above problems due to vibration can occur not only with an exposure apparatus, but also with a precision tool machine or a precision measuring device or the like as well. That is to say, it can happen that vibration set up within a precision tool machine or a precision measuring device, or vibration transmitted from the outside, can deteriorate the processing accuracy in the case of a precision tool machine, or the measurement accuracy in the case of a precision measuring device.

SUMMARY OF THE INVENTION

A first objective of the present invention is to enhance the throughput of an exposure apparatus and the accuracy of positional determination for a moving stage thereof, by suppressing vibration set up in a reaction frame.

A second objective of the present invention is to enhance the accuracy of relative position determination between an exposure apparatus main body and an illumination optical system which are provided as mutually separate units, by suppressing vibration set up due to movement of a movable element housed in the illumination optical system.

A third objective of the present invention is to propose a vibration cancellation apparatus which can be provided to a device etc. for which reduction of vibration is called for, such as a precision tool machine or a precision measuring device or the like.

In order to attain the above described objectives, the vibration cancellation apparatus according to this invention comprises: a base member; a movable element which is set up upon the base member, and is movable upon the base member; a reaction transmission member which discharges reaction generated when the movable element moves upon the base member by transmitting it to a surface of a foundation floor of the base member; a vibration detection device which detects vibration generated in the reaction transmission member; a weight which is movable in a direction to reduce the vibration, and which is provided to the reaction transmission member; and a vibration cancellation drive device which drives the weight so as to reduce the vibration, based upon the vibration detected by the vibration detection device.

According to this invention, when reaction generated when the movable element which is movable on the vibration cancellation table is driven is transmitted via the reaction transmission member to the surface of the foundation floor, it is possible to reduce the vibration set up in the reaction transmission member over a short time period by detecting vibration which is set up in the reaction transmission member to drive the weight so as to decrease this vibration. By doing this, it also becomes possible to suppress over a short time period vibration of the vibration cancellation table generated by vibration in the reaction transmission member being transmitted to the vibration cancellation table.

The present invention can also be applied to an exposure apparatus which projects a pattern formed on a mask substrate via a projection optical system onto a substrate upon a substrate stage. And the exposure apparatus according to this invention comprises the vibration cancellation apparatus including a base member; a movable element which is set up upon the base member, and is movable upon the base member; a reaction transmission member which discharges reaction generated when the movable element moves upon the base member by transmitting it to a surface of a foundation floor of the base member; a vibration detection device which detects vibration generated in the reaction transmission member; a weight which is movable in a direction to reduce the vibration, and which is provided to the reaction transmission member; and a vibration cancellation drive device which drives the weight so as to reduce the vibration, based upon the vibration detected by the vibration detection device. According to this invention, over a short time period it is possible to reduce undesirable vibration of the exposure apparatus main body generated by vibration of the reaction transmission member being transmitted. By doing this, it becomes possible to enhance the throughput of the exposure apparatus.

Further, the exposure apparatus according to this invention may include a mask stage; a substrate stage; an exposure apparatus main body which includes a projection optical system which projects a pattern image on a mask substrate which is set up on the mask stage upon a substrate which is set up on the substrate stage; an illumination unit for shining illumination light upon the mask substrate, set up upon the surface of the foundation floor of the exposure apparatus main body as a separate unit from the exposure apparatus main body; a vibration detection device which detects vibration generated in the illumination unit; a weight which is movable in a direction to reduce the vibration, and which is provided to the illumination unit; and a vibration cancellation drive device which drives the weight so as to reduce the above described vibration, based upon the vibration detected by the vibration detection device. According to this invention, it is possible to suppress undesirable vibration by detecting vibration set up in the illumination unit, and by driving the weight so as to reduce this vibration. By doing this, it becomes possible to maintain the accuracy of relative positional determination between the illumination unit and the exposure apparatus main body.

Further, the present invention may be applied to a vibration cancellation apparatus which includes a vibration detection device which is provided to a vibration cancellation object, and which outputs a vibration signal according to the magnitude of vibration generated in the vibration cancellation object; a weight which is provided so as to be capable of relative movement with respect to the vibration cancellation object; a drive device which generates relative movement between the weight and the vibration cancellation object; and a position determination device which determines the position of the weight and outputs a position signal according to the position of the weight. And the drive device performs control based upon a first control loop which controls the drive speed of the weight based upon the vibration signal, and a second control loop which moves the weight to a specified position based upon the position information.

According to this invention, by having a control loop in which the position of the weight is shifted to a specified position based upon a position signal output from the position detection device of value according to the position of the weight, it becomes possible to drive this weight while leading it to the specified position. Accordingly, it becomes possible to prevent the impropriety of the weight undesirably becoming gradually displaced from its specified position while being driven, and as a result the weight undesirably arriving outside of its range of movement.

Further, the vibration cancellation apparatus according to the present invention may further include a control device which controls the drive device based upon the first control loop and the second control loop; and this control device may include a first filter device which reduces intensity of the vibration signal with respect to a frequency component outside a predetermined band, and a second filter device which reduces intensity of the position signal with respect to a frequency component outside a predetermined band. In this vibration cancellation apparatus, the drive device is controlled so as to reduce the vibration by performing the first control loop based upon the vibration signal which has been filtered by the first filter device, and by performing the second control loop based upon the position signal which has been filtered by the second filter device.

According to this invention, it is possible to drive the weight based upon the frequency components of the signals which are required for reducing the vibration of the vibration cancellation object, by reducing the signal intensity outside previously determined frequency bands by the first and second filter devices. Due to this, the inconvenience of generation of undesirable vibration in the vibration cancellation object is prevented by quelling only vibrations of the frequency components which are substantially suitable for vibration cancellation.

Furthermore, with regard to the second control loop, this second control loop may set the drive speed of the weight so as not to generate new vibration in the vibration cancellation object when the drive device is driving the weight based upon the second control loop. By doing this, it becomes possible to suppress the generation of undesirable vibrations when the drive device is driving the weight.

Further, with the vibration cancellation apparatus according to the present invention, the mass of the weight may also be adjustable. By making the mass of the weight adjustable in this manner, it becomes possible to adjust the mass of the weight according to the magnitude of the vibrations set up in the vibration cancellation object, and according to the mass of the vibration cancellation object.

Yet further, in the vibration cancellation apparatus according to the present invention, the drive device may also be a linear motor. By constructing the drive device as a linear motor, it is possible to suppress the generation of undesirable new vibration during vibration cancellation, since it is possible to suppress the generation of the undesirable reactions (moments) in the rotational direction which are generated when, for example, a rotational type motor starts, accelerates, decelerates, and stops.

Furthermore, in the vibration cancellation apparatus according to the present invention, it is desirable that, in the linear motor, a coil should be disposed in a fixed section side, while a moving magnet and the weight are disposed in a movable section side. By disposing the coil on the fixed section side in this manner, it is possible to reduce the mass of the weight, since it is possible to drive the moving magnet which has a mass which is great compared to that of the coil together with the weight. Accordingly it is possible to reduce the size and weight of the vibration cancellation apparatus as a whole. Further, by disposing the coil on the fixed section side, it also becomes difficult for problems such as breaking of the wires and the like to occur, since it cannot happen for the cables for supplying electrical power to the coil to become slackened or stretched.

Yet further, the vibration cancellation apparatus according to the present invention may include a first vibration detection device which is provided to a vibration cancellation object, and which outputs a first vibration signal according to the magnitude of vibration generated in the vibration cancellation object; a weight which is provided so as to be capable of relative movement with respect to the vibration cancellation object; a second vibration detection device which is provided to the weight, and which outputs a second vibration signal according to the magnitude of vibration generated in the weight; and a drive device which generates drive force which causes relative movement between the weight and the vibration cancellation object; and the drive device may perform control based upon the first vibration signal and the second vibration signal.

According to this invention, it is possible to maintain a predetermined state of coupled vibration between the vibration system which includes the weight and the vibration system which includes the vibration cancellation object by using the first vibration signal which is output from the first vibration detection device and the second vibration signal which is output from the second vibration detection device. By doing this it is possible to reduce the peak value of the vibration, and thereby it becomes possible to quell the vibration quickly.

The vibration cancellation apparatus according to this invention may further include a resilient member which is connected in parallel equivalently to the drive device between the vibration cancellation object and the weight. Also by further providing the resilience member connected in parallel equivalently to the drive device in this manner, it is possible to maintain a predetermined state of coupled vibration between the vibration system which includes the weight and the vibration system which includes the vibration cancellation object. By doing this it is possible to reduce the peak value of the vibration, and thereby it becomes possible to quell the vibration quickly.

Yet furthermore, the present invention may be a vibration cancellation apparatus for reducing vibration generated in a vibration cancellation object, and may include a vibration detection device which outputs a vibration signal according to the magnitude of vibration generated in the vibration cancellation object; a drive device which generates a drive force to reduce the vibration, based upon the vibration signal; a support member which supports the vibration detection device and the drive device; and a fixing device which fixes the support member to the vibration cancellation object in a removable manner. According to this type of structure, it becomes easy to fix the vibration cancellation apparatus to the vibration cancellation object, and to detach it therefrom.

In the vibration cancellation apparatus according to this invention, the support member may be a casing member which houses the vibration detection device and the drive device in its interior. In this manner, by making the support member as a casing member which houses the vibration detection device and the drive device in its interior, improvement of the compactness and unitary construction of the vibration cancellation apparatus become easy, and it is possible easily to fit and to detach the vibration cancellation apparatus to and from the subject for vibration control or vibration cancellation countermeasures.

Finally, the present invention may be applied to an exposure apparatus in which a predetermined image is formed upon a substrate which is mounted upon a substrate stage, equipped with any one of the vibration cancellation apparatus described above. According to this kind of exposure apparatus, it becomes possible to quell vibration which is generated in the exposure apparatus very quickly. As a result, it becomes possible to enhance the throughput of the exposure apparatus. Furthermore, by also making it possible to reduce vibration during exposure action, it becomes possible to enhance the accuracy of the pattern which is formed upon the substrate.

DESCRIPTION OF THE PREFERRED EMBODIMENTS

Embodiment 1

OVERALL STRUCTURE OF THE PROJECTION EXPOSURE APPARATUS

Figure 1:
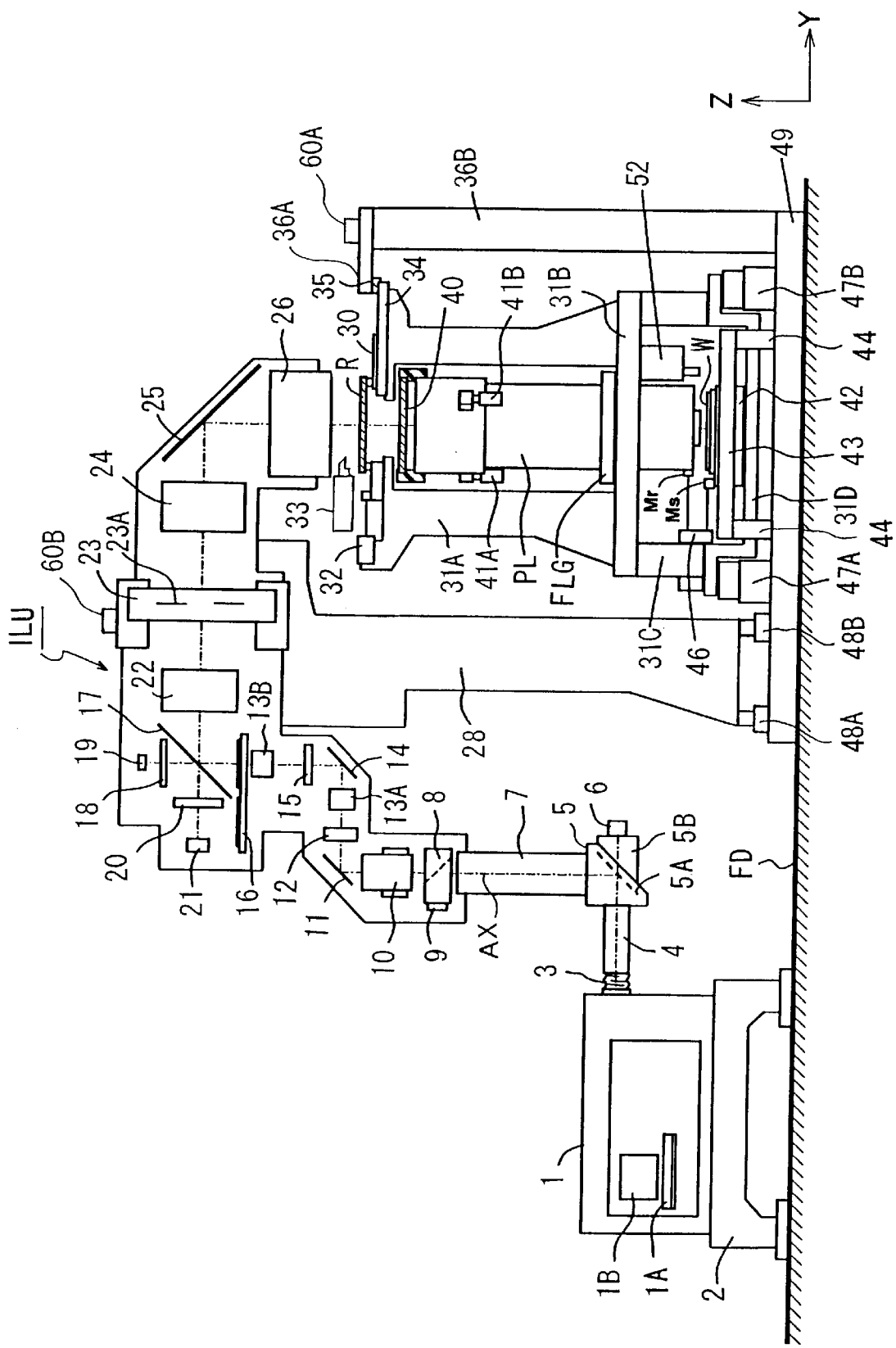
FIG. 1 is a figure showing an example of application of the vibration cancellation apparatus according to the present invention to an exposure apparatus.

First the overall structure of a projection exposure apparatus suitable for the realization of the present invention will be explained with reference to FIG. 1. FIG. 1 shows the structure of a step-and-scan type projection exposure apparatus which uses an ArF excimer laser light source 1 whose band is narrow and between 192 and 194 nm wavelengths in which the absorption band of oxygen is avoided. In the step-and scan type projection exposure apparatus, while projecting a circuit pattern on a mask such as a reticle or the like (hereinafter termed the "reticle R") upon a substrate such as a semiconductor wafer or the like (hereinafter termed the "wafer W") via a projection optical system PL, relative scans of the reticle R and the wafer W is performed.

THE EXCIMER LASER LIGHT SOURCE

Referring to FIG. 1, the main body of an ArF excimer laser light source 1 is set up upon a floor FD in a clean room in a semiconductor manufacturing facility (according to circumstances it may be outside the clean room) via a vibration isolation stand 2. And a dedicated light source control system 1A, which includes an input unit such as a keyboard or a touch panel or the like, and a display 1B are provided in the main body of the laser light source 1, and control of the central oscillation wavelength of pulsed light emitted from the laser light source 1, trigger control for pulse oscillation, control of the gas in the laser chamber, and so on are automatically performed.

THE ILLUMINATION UNIT

Pulsed ultraviolet light emitted from the ArF excimer laser light source 1 whose band is narrow passes through a bellows 3 and a pipe 4 which shield light and is reflected by a movable mirror 5A in a beam matching unit 5 (hereinafter termed the "BMU") which positionally matches optical path with the exposure apparatus main body. Then Pulsed ultraviolet light arrives via a pipe 7 which shield light at a beam splitter 8 for detection of optical intensity, and here the larger proportion of the light passes through, while a small amount thereof (for example about 1%) is reflected towards a light amount detector 9.

The pulsed ultraviolet light which has passed through the beam splitter 8 is incident upon a variable dimming system 10 which, along with adjusting the cross sectional shape of the beam, adjusts the intensity of this pulsed ultraviolet light. This variable dimming system 10 comprises a drive motor, and adjusts the dimming ratio of the pulsed ultraviolet light either by steps or continuously, according to commands from a main control system not shown in FIG. 1.

Further, the direction of the reflecting face of the movable mirror 5A is adjusted in two dimensions by an actuator 5B. In this specification, the actuator 5B is feedback controlled, or is feed forward controlled, based upon a signal from a detector 6 which receives a light beam for position monitoring emitted on the same axis as the pulsed ultraviolet light from a visible light source (a semiconductor laser, a He—Ne laser, or the like) housed in the laser light source 1.

For this, the movable mirror 5A is manufactured so as to have a high transparency ratio at the wavelength of the beam for position monitoring while it has a high reflection ratio at the wavelength of the pulsed ultraviolet light. The detector 6 is structured as a four-part sensor, a CCD imaging element or the like so as photoelectrically to detect variation of the position of the incident light beam for position monitoring which has passed through the movable mirror 5A. On the other hand, driving of the actuator 5B which tilts the movable mirror 5A may also be performed in response to a signal from an acceleration sensor or a position sensor which specially detects vibration of the exposure apparatus main body with respect to the floor FD, instead of in response to the signal from the detector 6.

To continue, the pulsed ultraviolet light which has passed through the variable dimming system 10 is incident upon the reticle R after having passed through an illumination unit ILU. The illumination unit ILU comprises a fixed mirror 11 which is disposed upon a predetermined optical axis AX, a condenser lens 12, a first fly-eye lens 13A which serves as an optical integrator, a vibration mirror 14 for reducing coherence, a condenser lens 15, a second fly-eye lens 13B, a exchangeable spatial filter 16 for changing over the distribution of the light source image, a beam splitter 17, a first focusing lens system 22, a reticle blind mechanism 23 which includes a visual field restriction aperture or a field stop aperture 23A which regulates the illumination range upon the reticle R into a rectangular slit form, a second focusing lens system 24, a reflecting mirror 25, and a main condenser lens system 26.

Further, approximately a few percent of the pulsed ultraviolet light which is emitted from the above described spatial filter 16 and has passed through the beam splitter 17 is incident upon a photoelectric detector 19 via an optical system 18 which includes a condenser lens and a diffusion plate. In the case of this embodiment, basically the exposure conditions during scanning exposure are determined by calculation processing the photoelectric detection signal from the photoelectric detector 19 by a processing circuit for exposure amount control.

Further, a condenser lens system 20 and a photoelectric detector 21 which are disposed on the left side of the beam splitter 17 in FIG. 1 serve to photoelectrically detect the optical intensity of reflected light from the wafer W on which illumination light for exposure is incident via the projection optical system PL and the main condenser lens 26. The reflection ratio of the wafer W is detected based upon this photoelectric signal.

In the above described structure, the incident surface of the first fly-eye lens 13A, the incident surface of the second fly-eye lens 13B, the surface of the aperture 23A of the reticle blind mechanism 23, and the pattern surface of the reticle R are arranged so as to be mutually conjugated with each other. The light source surface which is constituted by the emission side surface of the first fly-eye lens 13A, the light source surface which is constituted by the emission side surface of the second fly-eye lens 13B, and the Fourier conversion surface (the exit pupil surface) of the projection optical system PL are arranged so as to be mutually conjugated with each other. And a köhler illumination system is made up in this manner. Accordingly, the pulsed ultraviolet light is converted into illumination light of a uniform intensity distribution at the surface of the field stop aperture 23A in the reticle blind mechanism 23 and at the pattern surface of the reticle R.

The above described illumination unit ILU is arranged in an illumination system housing (not shown in the figures) which is made airtight with respect to the external atmosphere. This illumination system housing is set up upon a support column 28 which is erected upon a base frame 49 for setting up the exposure apparatus main body upon the floor FD. Vibration isolation units or vibration proof units 48A through 48D (the vibration proof units 48C and 48D which are located behind the plane of the drawing paper in FIG. 1 are not shown in this figure) are interposed between the base portion of the support column 28 and the base frame 49. These vibration proof units 48A–48D are intended to isolate vibration from the floor FD as well as performing relative positional determination between the illumination unit ILU and the exposure apparatus main body. Further, the illumination system housing is filled with clean dried nitrogen gas or helium gas containing less than a few percent of air (oxygen), desirably less than 1%.

THE RETICLE BLIND

The field stop aperture 23A in the reticle blind mechanism 23 in this embodiment is disposed in a rectilinear slit form or a rectangular form in the center of the circular visual field of the projection optical system PL and extends in the direction perpendicular to the direction of scanning exposure, as disclosed for example in Patent Laying Open Publication Heisei 4-196513. Further, a movable blind is provided in the reticle blind mechanism 23 in order to vary the width of the illumination visual region upon the reticle R due to the field stop aperture 23A in the direction of scanning exposure, and, thanks to this movable blind, reduction of the stroke during scanning displacement of the reticle R, and reduction of the width of the light interception band on the reticle R are contemplated, as disclosed in Patent Laying Open Publication Heisei 4-196513.

The pulsed ultraviolet illumination light which in this manner has been given a uniform intensity distribution by the illumination field stop aperture 23A of the reticle blind mechanism 23 is incident upon the condenser lens system 26 via the focusing lens system 24 and the reflection mirror 25, comes to be formed in a shape which is similar to that of the rectangular shaped or slit shaped aperture portion of the aperture 23A, and uniformly illuminates a portion of the circuit pattern region on the reticle R.

THE RETICLE STAGE

The reticle R is fixed by vacuum air upon the reticle stage 30. The position of the reticle stage 30 is measured in real time by a laser interferometer 32, and is shifted during scanning exposure at a predetermined speed Vr in the left and right direction in FIG. 1 (the Y-axis direction) by a drive unit 34 which includes a linear motor or the like. Moreover, as well as measuring the positional displacement of the reticle stage 30 in the scanning direction (the Y-axis direction), the laser interferometer 32 also measures in real time the positional displacement and the rotational displacement in the non-scanning direction (the X-axis direction). During scanning exposure a drive motor (a linear motor or a voice coil motor) of the drive unit 34 drives the stage 30 so as to keep these measured positional and rotational displacements in predetermined states.

THE REACTION FRAME

The above described reticle stage 30, laser interferometer 32, and drive unit 34 (the stator side of the linear motor) are fixed upon the upper portions of support columns 31A of the exposure apparatus main body. Further, at the upper end portions of the support columns 31A there is provided an actuator 35 for absorbing reaction force in the scanning direction generated during a period of acceleration, or during a period of deceleration, of scanning displacement of the reticle stage 30. The stator side of this actuator 35 is fixed by an attachment element 36A to a reaction frame 36B which is mounted near an edge portion of the base frame 49.

THE PROJECTION OPTICAL SYSTEM

When the recticle R is illuminated by pulsed ultraviolet illumination, the light which has passed through the illuminated portion of the circuit pattern on the reticle R is incident upon the projection optical system PL. Upon each pulse of ultraviolet illumination light, a partial image of this circuit pattern is restricted into slit form or rectangular form (polygonal) and focused in the center of the circular visual field of the image surface side of the projection optical system PL. And the projected partial image of the circuit pattern is transferred onto and photographed upon a resist layer of one of a plurality of shot region surfaces upon the wafer W which is disposed at the focusing surface of the projection optical system PL.

An image distortion compensation plate (a quartz plate) 40 is disposed on the reticle R side of the projection optical system PL for reducing dynamic distortion aberration generated during scanning exposure, in particular the random distortion characteristic. The surface of this compensation plate 40 is locally polish processed to the order of the wavelength, and this plate 40 serves for minutely deflecting the principal ray of an imaginary light flux within the projection visual field.

In the projection optical system PL there are provided actuators 41A and 41B for automatically adjusting the focusing characteristics (the projection magnification and some types of distortion) by shifting a prescribed internal lens element in parallel to the optical axis, and by minutely tilting it, based upon the results of detection of the distortion state of the shot region on the wafer W which is to be exposed. The results of detection of temperature variation of the media (the optical elements and the fill gas) in the projection optical path, and the results of detection of internal pressure change within the projection optical system PL due to variation of atmospheric pressure.

Moreover, in this embodiment, the projection optical system PL is constructed only with refracting optical elements (quartz lenses and fluorite lenses), and the object surface (the reticle R) side and the image surface (the wafer W) side together form a telecentric system.

THE WAFER STAGE

The wafer W is fixed by vacuum air upon a wafer stage 42 which moves in two dimensions in an XY plane parallel to the image plane of the projection optical system PL. The position of this wafer stage 42 is measured in real time by a laser interferometer 46 which measures positional variation of a moving mirror Ms which is fixed to a portion of the wafer stage 42, taking as reference a reference mirror Mr which is fixed to the lower end of a lens barrel of the projection optical system PL. Based upon the results of this measurement, the wafer stage 42 is two dimensionally shifted upon a stage base plate 31D by a drive unit 43 which includes a number of linear motors.

THE SUPPORT FRAME

The stators of the linear motors which make up the drive unit 43 are fixed to the base frame 49 via a support frame 44 independent of the base plate 31D, so that the reaction forces generated during moving acceleration or deceleration of the wafer stage 42 come to be transmitted directly to the floor FD, not the base plate 31D. Due to this, the reaction forces which accompany movement of the wafer stage 42 during scanning exposure do not act upon the exposure apparatus main body, and vibration and stress in the exposure apparatus main body are reduced.

Moreover, during scanning exposure, the wafer stage 42 is driven at a uniform speed Vw in the left and right directions in FIG. 1 (the Y-axis direction). Further, the wafer stage 42 is moved stepwise in the X-axis and Y-axis directions when scanning exposure upon one die has been completed and the die which is to be the next subject of scanning exposure is to be moved into the projection region of the projection optical system PL. And the laser interferometer 46 measures, not only the positional displacement in the Y-axis direction, but also the positional displacement in the X-axis direction and the rotational displacement of the wafer stage 42 in real time. Based upon the results of this measurement, driving is performed by the drive motors of the drive unit 43 so as to bring the positional displacement of the stage 42 into a specified state.

Furthermore, information about the rotational displacement of the wafer stage 42 measured by the laser interferometer 46 is sent via the main control system in real time to the drive unit 43 of the reticle stage 30, and errors in rotational displacement on this wafer side are controlled by rotational control on the reticle R side so as to be compensated.

THE VIBRATION PROOF UNIT

Now, the four corners of the stage base plate 31D are supported upon the base frame 49 via vibration proof units 47A through 47D (the vibration proof units 47C and 47D are not shown in FIG. 1, because they are located behind the plane of the drawing paper) which include actuators. Above each of the vibration proof units 47A and 47B there is mounted a respective support pillar 31C, and above this there is provided a base table 31B to which is fixed a flange FLG which is fixed to the outer wall of the lens barrel of the projection optical system PL. Furthermore the above described support columns 31A are attached above the base table 31B.

Each of the vibration proof units 47A through 47D constructed as described above is controlled by a control system which will be described hereinafter. That is, the control system controls the vibration proof units 47A through 47D in response to signals from the attitude detection sensors which monitor attitude changes of the exposure apparatus main body with respect to the floor FD. The control system further controls each of the vibration proof units 47A through 47D by feed forward control according to the amounts of displacement of the reticle stage 30 and of the wafer stage 42. By doing this, the attitude of the exposure apparatus main body is always maintained stable, irrespective of the center of gravity changes which accompany the movement of the reticle stage 30 and of the wafer stage 42.

THE CONTROL SYSTEM

Although it is not shown in FIG. 1, each of the drive units and actuators etc. of the exposure apparatus main body is generally controlled by a main control system. The main control system comprises unit controllers which control each of the drive units and actuators individually. A reticle side controller and a wafer side controller are representative of these unit controllers. The reticle side controller deals with various types of information, such as the displaced position, the displacement speed, the displacement acceleration, the position offset of the reticle stage 30 and the like. And the wafer side controller deals with various types of information, such as the displaced position, the displacement speed; the displacement acceleration, the position offset of the reticle stage 30 and the like.

Particularly during scanning exposure, the main control system synchronously controls the reticle side controller and the wafer side controller so that the displacement speed Vr of the reticle stage 30 in the Y-axis direction and the displacement speed Vw of the wafer stage 42 in the Y-axis direction are maintained at a speed ratio appropriate to the projection magnification of the projection optical system PL (1/5 or 1/4). Furthermore, during scanning exposure, the main control system dispatches commands for controlling the movement of each of the blades of a movable blind which is provided inside the above described reticle blind mechanism 23, in synchrony with the movement of the reticle stage 30. And, further, the control system sets various exposure conditions for performing scanning exposure of the shot region on the wafer W at a proper exposure amount (the target exposure amount). The control system also cooperates with an exposure controller which controls the light source control system 1A of the excimer laser light source 1 and the variable dimming system 10 so as to execute a suitable exposure sequence.

THE RETICLE ALIGNMENT SYSTEM AND THE WAFER ALIGNMENT SYSTEM

Apart from the above structure, in this embodiment a reticle alignment system 33 for aligning the initial position of the reticle R is provided outside the illumination optical path between the reticle R and the main condenser lens system 26. This system 33 photoelectrically detects marks which are formed upon the outside of the circuit pattern region which is surrounded by a light interception band on the reticle R. Further, on the lower side of the base table 31B there is provided an off-axis type wafer alignment system 52 for photoelectrically detecting alignment marks which are formed in each of the shot regions on the wafer W.

THE VIBRATION CANCELLATION UNIT

Respective vibration cancellation units 60A and 60B are set up in the reaction frame 36B and the illumination unit ILU. These vibration cancellation units 60A and 60B are active vibration cancellation apparatus, and as will be described hereinafter the vibration cancellation unit 60A suppresses vibrations generated in the reaction frame 36B, while on the other hand the vibration cancellation unit 60B suppresses vibrations generated in the illumination unit ILU which is supported by the support columns 28.

Figure 2A:
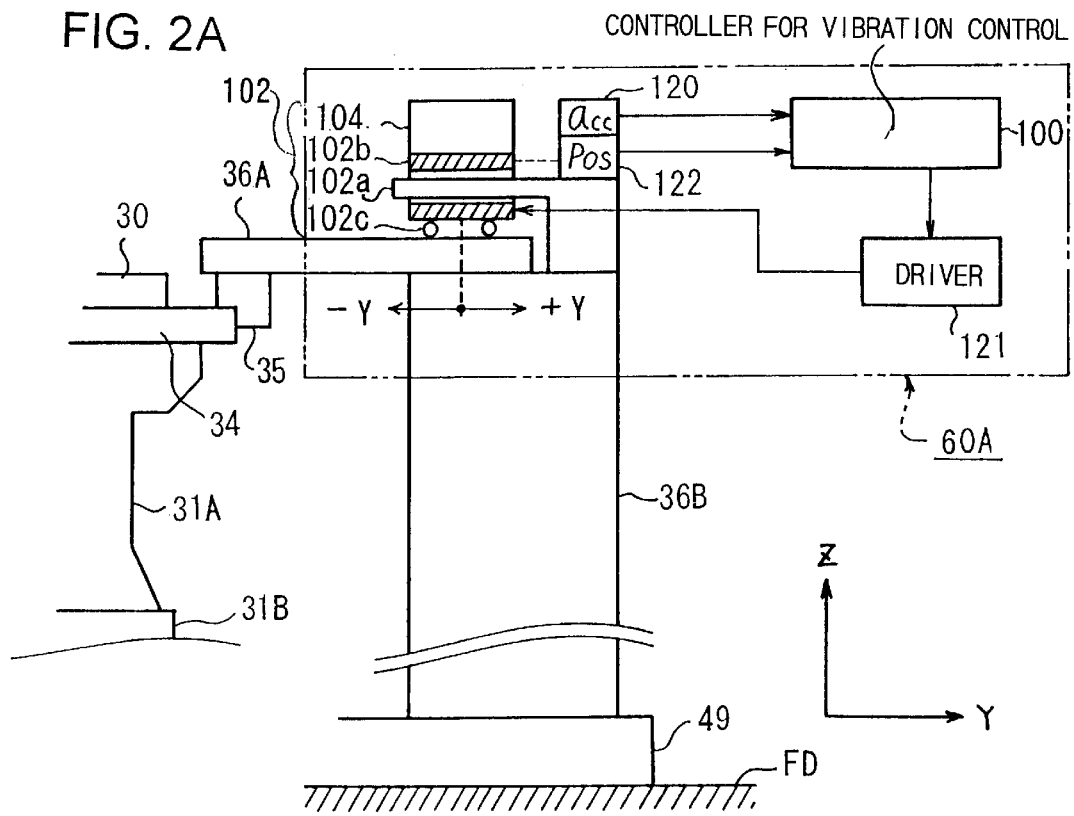
FIG. 2A is a block diagram showing the overall structure of the vibration cancellation apparatus.
Figure 2B:
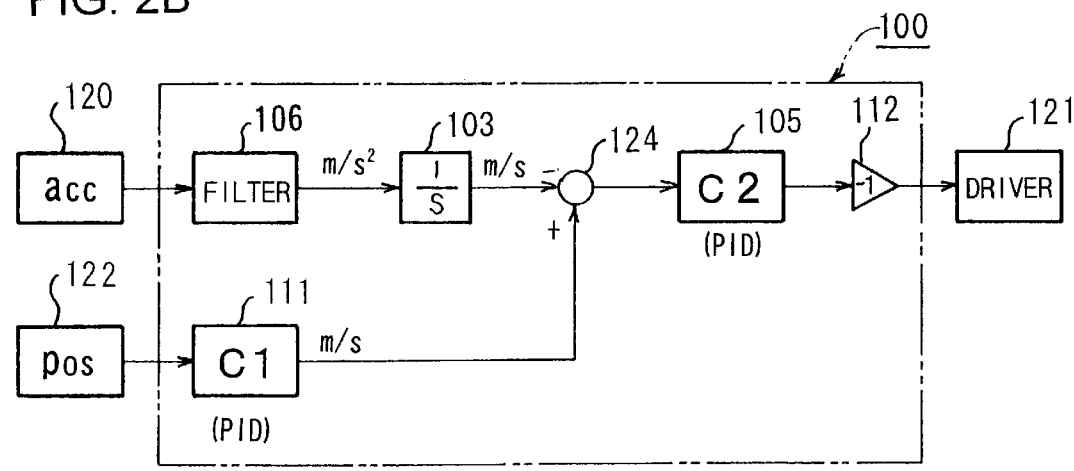
FIG. 2B is a block diagram showing the internal structure of a vibration cancellation control section.

The structure of these vibration cancellation units 60A and 60B will now be explained with reference to FIG. 2A and FIG. 2B. Moreover, in FIG. 2A only the structure of the vibration cancellation unit 60A is shown, but, since the structure of the vibration cancellation unit 60B is identical to the structure of the vibration cancellation unit 60A, drawings and explanation thereof will be curtailed.

As shown in FIG. 2, the vibration cancellation unit 60A comprises a vibration cancellation control section 100, an acceleration sensor 120, a position sensor 122, a driver 121, a weight drive unit 102, and a weight 104. The weight drive unit 102 comprises a movable section 102b which is supported on the reaction frame 36B by a rollers 102C, and a stator 102A which is fixed to the reaction frame 36B. The weight 104 is fixed to the movable section 102b. And the weight of the weight 104 is adjusted so that the sum of the mass of the movable section 102b and the mass of the weight 104 is equal to a specified mass m2. A linear motor is housed in the movable section 102b, and the movable section 102b can thus be driven in the Y-axis direction in the figure by electrical current supplied by the driver 121 due to magnetic force generated against the stator 102a. In other words, relative movement between the stator 102a and the movable section 102b is generated. In this case, when an acceleration α is generated in the movable section 102b of total mass m2, its reaction force R (=m2×α) acts upon the reaction frame 36B via the stator 102a, and this constitutes a vibration cancellation force, in other words a vibration reduction force with respect to the reaction frame 36B.

The vibration cancellation control section 100 will now be explained with reference to FIG. 2B. This vibration cancellation control section 100 comprises a filter 106, an integrator 103, a subtractor 124, controllers 105 and 111, and an amp (an inverting amplifier) 112. This vibration cancellation control section 100 may also be constructed with a CPU, or may be constructed with logic circuits or analog circuits.

When vibration of the reaction frame 36B is detected by the acceleration sensor 120, a signal corresponding to raid vibration to be cancelled which pertains to a vibration cancellation mode is discriminated by the filter 106. A secondary bandpass filter may, for example, be used as this filter 106. The output from the filter 106 is integrated by the integrator 103 and is converted into a signal related to the speed of the reaction frame 36B.

On the other hand, a signal related to the position of the movable section 102b which is output by the position sensor 122 is input to the controller 111. It is possible to use a PID compensator, for example, as the controller 111. The position sensor 122 and the controller 111 are used to prevent the movable section 102b from deviating (drifting) from its central position. In other words, when the position of the movable section 102b has deviated in the +Y or the −Y direction shown in FIG. 2A, the controller 111 outputs a speed command value so as to return the movable section 102b to its zero position. At this time, if the position control responsiveness of the controller 111 is set high, the speed when returning the movable section 102b to its central position is increased, and conversely undesirable increase in the vibration of the reaction frame 36B occurs. Accordingly, it is desirable to set the position control responsiveness of the controller 111 to be comparatively low.

The outputs from the integrator 103 and the controller 111 are input to the subtractor 124. And the difference between the output from the integrator 103 and the output from the controller 111 is input to the controller 105. The controller 105 calculates the thrust which should be generated by the movable section 102b based upon the input results of the signal from the subtractor 124, and outputs a command value corresponding to this thrust.

The command value output from the controller 105 is imparted with minus 1 gain by the inverting amplifier 112 and is input to the driver 121. As a result, electrical power is supplied from the driver 121 to the weight drive unit 102 for generating a thrust in the direction to quell the vibration detected by the acceleration sensor 120. Moreover, in the structure of FIG. 2B, it would also be acceptable not to provide the inverting amplifier 112, but to arrange for the vibration to be quelled by directly inputting the output of the controller 105 to the driver 121.

Figure 3A:
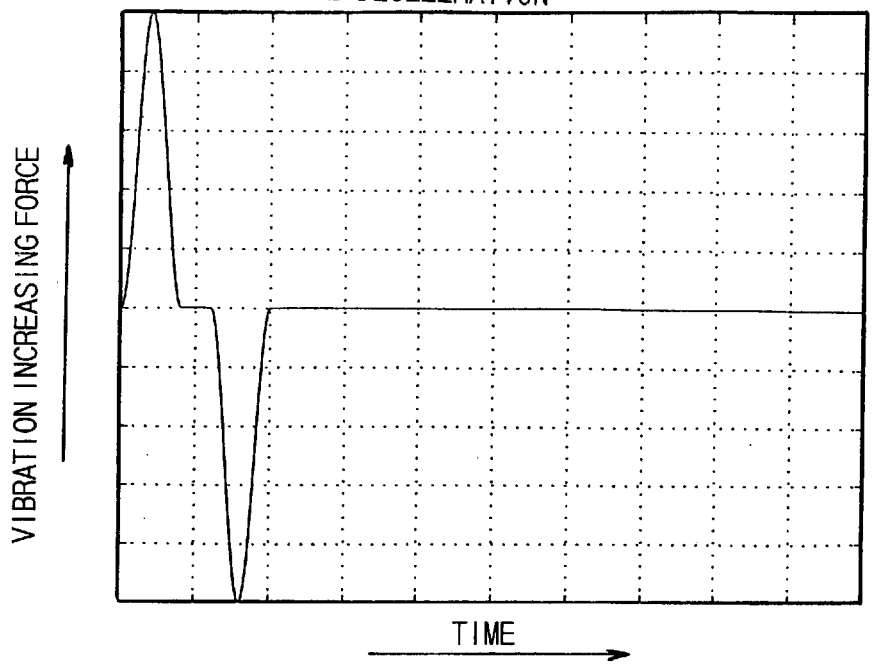
FIG. 3A is a figure showing the variation with time of reaction (vibration increasing force) acting on a reaction frame when a moving stage accelerates or decelerates.
Figure 3B:
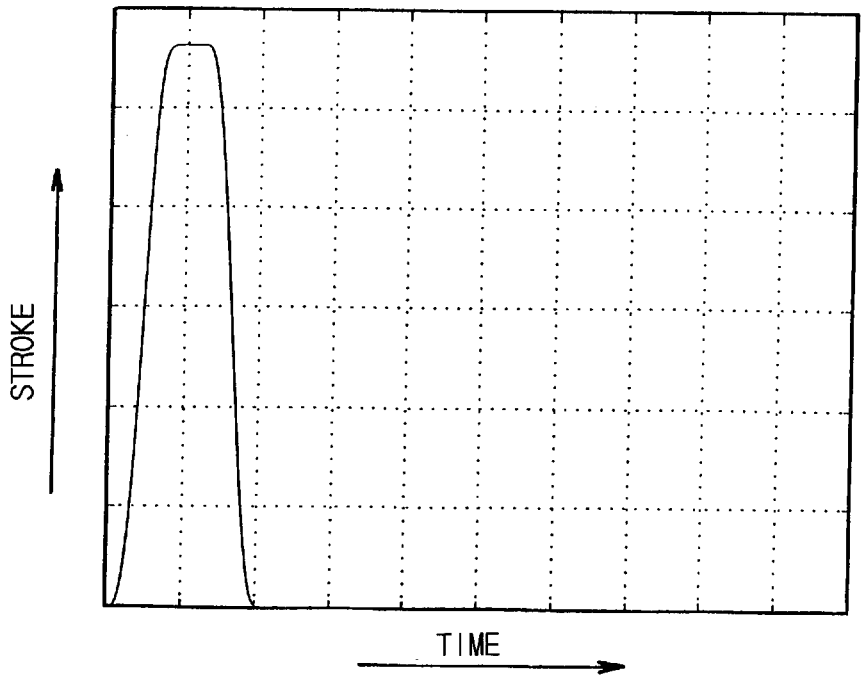
FIG. 3B is a figure showing the movement of a weight for reducing vibration generated due to this reaction.

The vibration suppression efficiency for the reaction frame due to the vibration cancellation unit 60A will now be explained with reference to FIG. 3A, FIG. 3B, FIG. 4A, and FIG. 4B. FIG. 3A shows a characteristic of the reaction acting upon the reaction frame 36B shown in FIG. 2A when the moving stage accelerates or decelerates. In this figure the vibration increasing force which acts upon the reaction frame 36B in the ±Y direction is shown along the vertical axis, while time is shown along the horizontal axis. FIG. 3B shows the movement of the movable section 102b shown in FIG. 2A in order to suppress vibration of the reaction frame 36B. In this figure the movement stroke of the movable section 102b is shown along the vertical axis, while time is shown along the horizontal axis. It should be noted that FIG. 3A and FIG. 3B both use the same time scale.

Figure 4A:
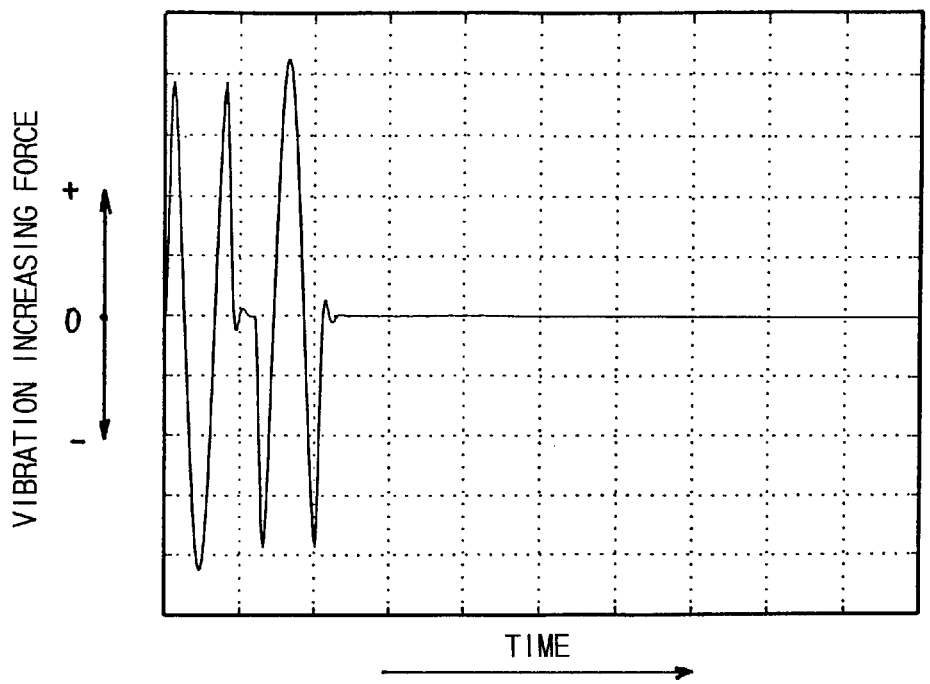
FIG. 4A is a figure for explanation of what happens during reduction of the vibration of the reaction frame by the vibration cancellation apparatus.
Figure 4B:
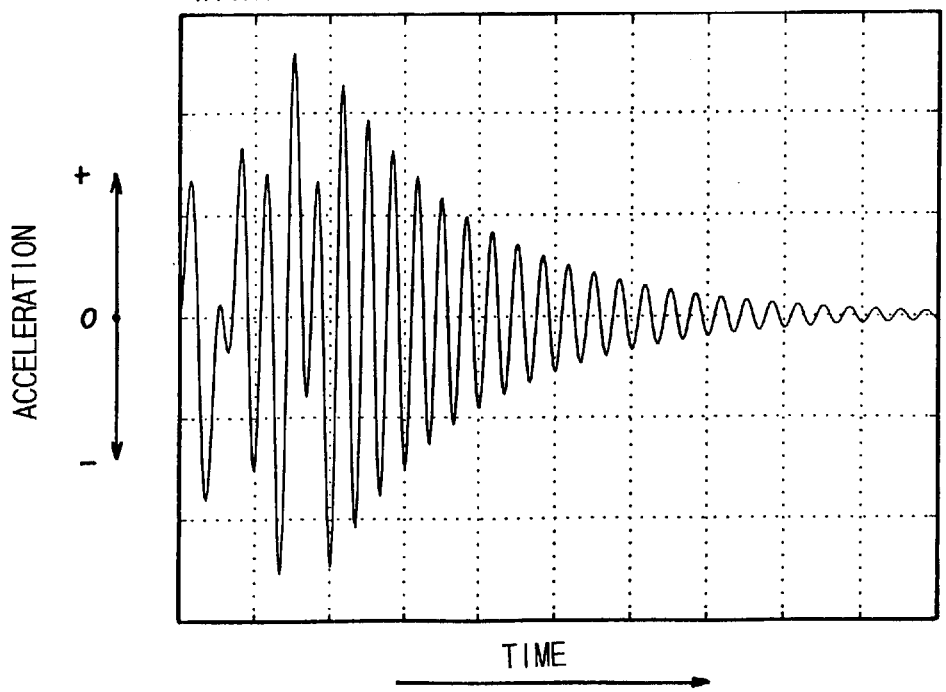
FIG. 4B is a figure showing what happens when no vibration cancellation control is performed.

As shown in FIG. 3A, when vibration increasing force acts upon the reaction frame 36B, vibration is set up in the reaction frame 36. The vibration cancellation control section 100 drives the movable section 102b as shown in FIG. 3B based upon the vibration of the reaction frame 36B detected by the acceleration sensor 120. Due to this, reaction generated when the movable section 102*b* and the counter weight, total mass of which is m2, accelerates or decelerates is transmitted to the reaction frame 36B via the stator 102*a*. As a result, vibration set up in the reaction frame 36B is attenuated over a short time period. FIG. 4A and FIG. 4B are for explanation of what happens at this time. FIG. 4A shows the vibration of the reaction frame 36B in the case that vibration cancellation control is performed, and FIG. 4B shows the case when no vibration cancellation control is performed. In both FIG. 4A and FIG. 4B time is shown along the horizontal axis using the same time scale, while acceleration is shown along the vertical axis using the same scale.

As shown in FIG. 4A, since vibration generated in the reaction frame 36B is attenuated over a short time period, also shortened is the time period over which vibrations of the reaction frame 36B are transmitted via the base frame 49 to the exposure apparatus main body to undesirably deteriorate the accuracy of position determination of the moving stage.

It becomes possible to enhance the throughput of the exposure apparatus by doing this.

In the above explanation, the reaction frame 36B is the element which receives the reaction of the moving stage of FIG. 1 in the Y-axis direction. Accordingly the vibration cancellation unit 60A is the one which reduces vibrations of the reaction frame 36B in the Y-axis direction only. In addition to the above example, if the moving stage is one which also moves in the direction perpendicular to the plane of the drawing paper in FIG. 1 (the X-axis direction), an identical construction may be applied to a vibration cancellation apparatus in the X-axis direction.

Further, vibrations generated at the illumination unit ILU supported by the support column 28 in FIG. 1 when the reticle blind mechanism 23 operates can be attenuated over a short time period by using the vibration cancellation unit 60B in the same manner as described above. Further, according to requirements, it would also be acceptable to set up vibration cancellation units upon the support frames 44, in the same manner as described above.

Although in the explanation of the above embodiment, the exposure apparatus shown in FIG. 1 is set up as a separate unit from the exposure apparatus main body and the illumination unit ILU, it would also be acceptable for it to be set up unitarily with this exposure apparatus main body and illumination unit ILU. This example will be explained with reference to FIG. 5. It should be noted that, in FIG. 5, to structural elements identical to the exposure apparatus of FIG. 1 the same reference symbols are affixed, and the explanation thereof will be curtailed. In the following, principally the differences from the FIG. 1 device will be explained.

Figure 5:
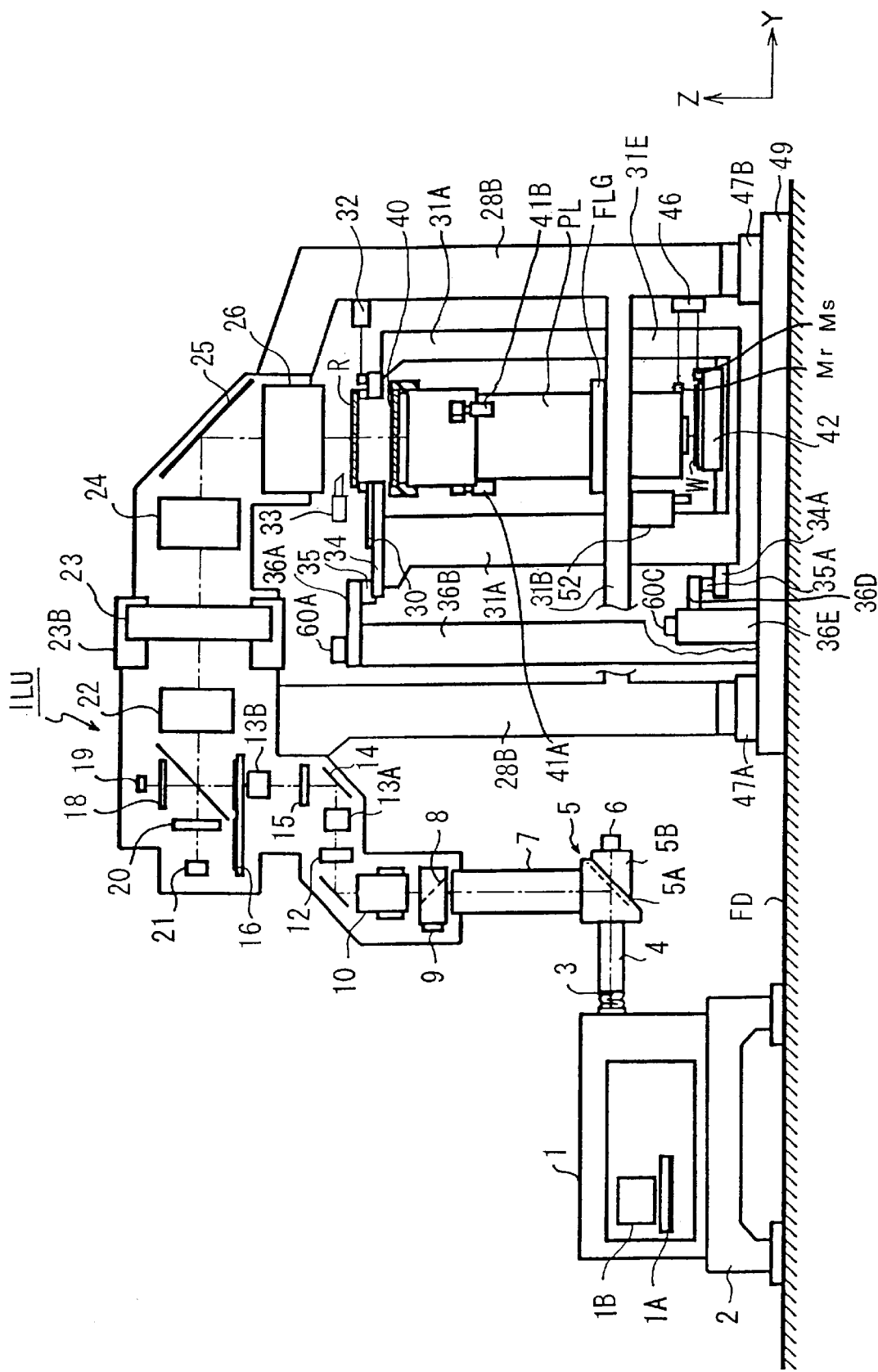
FIG. 5 is a figure showing an example of application of the vibration cancellation apparatus according to the present invention to an exposure apparatus which is different from the exposure apparatus shown in FIG. 1.

Referring to FIG. 5, the exposure apparatus main body and the illumination unit ILU are unitarily supported by support columns 28B. Vibration proof units 47A through 47D (in FIG. 5, the vibration proof units 47C and 47D are not shown because they are located behind the plane of the drawing paper) which include actuators are interposed between the support columns 28B and the base frame 49. A base table 31B which is attached to a flange FLG which is fixed to the outer wall of the lens barrel of the projection optical system PL is provided to the support columns 28B. Furthermore support columns 31A are attached upon the base table 31B. And the drive unit 34 and the reticle stage 30 are set up on top of the support columns 31A.

A lower frame 31E is suspended from the lower portion of the base table 31B. The drive unit 34A and the wafer stage 42 are set up on the lower frame 31E.

With the exposure apparatus constructed in the above manner, each of the vibration proof units 47A through 47D is controlled by a control system identical to the one explained with reference to FIG. 1.

The reaction frames 36B and 36E are set up upon the base frame 49. And the vibration cancellation unit 60A is set up upon the reaction frame 36B, along with the actuator 35. Further, the vibration cancellation unit 60C is set up upon the reaction frame 36E, along with the actuator 35A.

Either of the above-described actuators 35 and 35A, in the same manner as explained with reference to FIG. 1, is for absorbing reactions generated in these drive units 34 and 34A when the drive unit 34 accelerates or decelerates the reticle stage 30 and the drive unit 34A accelerates or decelerates the wafer stage 42. And the stators of each of the actuators are fixed to the reaction frames 36B and 36E via members 36A and 36D.

When as described above the reaction frames 36B and 36E release reactions generated in the drive units 34 and 34A to the floor surface FD, vibrations generated in the reaction frames 36B and 36E are reduced over a short time period by the vibration cancellation units 60A and 60C. By doing this it is possible to enhance throughput, in the same manner as with the exposure apparatus shown in FIG. 1.

It should be noted that, with the exposure apparatus shown in FIG. 5 as well, the moving stages do not only move along the Y-axis direction, but in the direction perpendicular to the drawing paper in FIG. 5 as well (the X-axis direction). Accordingly, it is possible to employ constructions identical to the one described above as a vibration cancellation apparatus in the X-axis direction as well.

Further, although in the explanation of the above embodiment the vibration cancellation apparatus is explained with respect to the case of application to an exposure apparatus of the step-and-scan type, it is also possible to apply it to a step-and-repeat type exposure apparatus, or to a charged particle beam projection apparatus.

In the above explained vibration cancellation unit, the vibration cancellation control section 100 is constructed to output control signals to the driver 121 for driving the movable section 102*b* so as to decrease vibrations of the reaction frame 36B detected by the acceleration sensor 20. That is to say, a feedback loop is set up so as to control the movement of the movable section 102*b* based upon the results of detection of vibrations generated in the reaction frame 36B. However it would also be acceptable to perform control of the movable section 102*b* according to a feed forward method. That is to say, when driving the reticle stage 30 or wafer stage 42, it would be acceptable to control the movement of the movable section 102*b* according to the expected acceleration or deceleration. Or it would also be acceptable to employ this feedback and feed forward control methods jointly.

Embodiment 2

Figure 6:
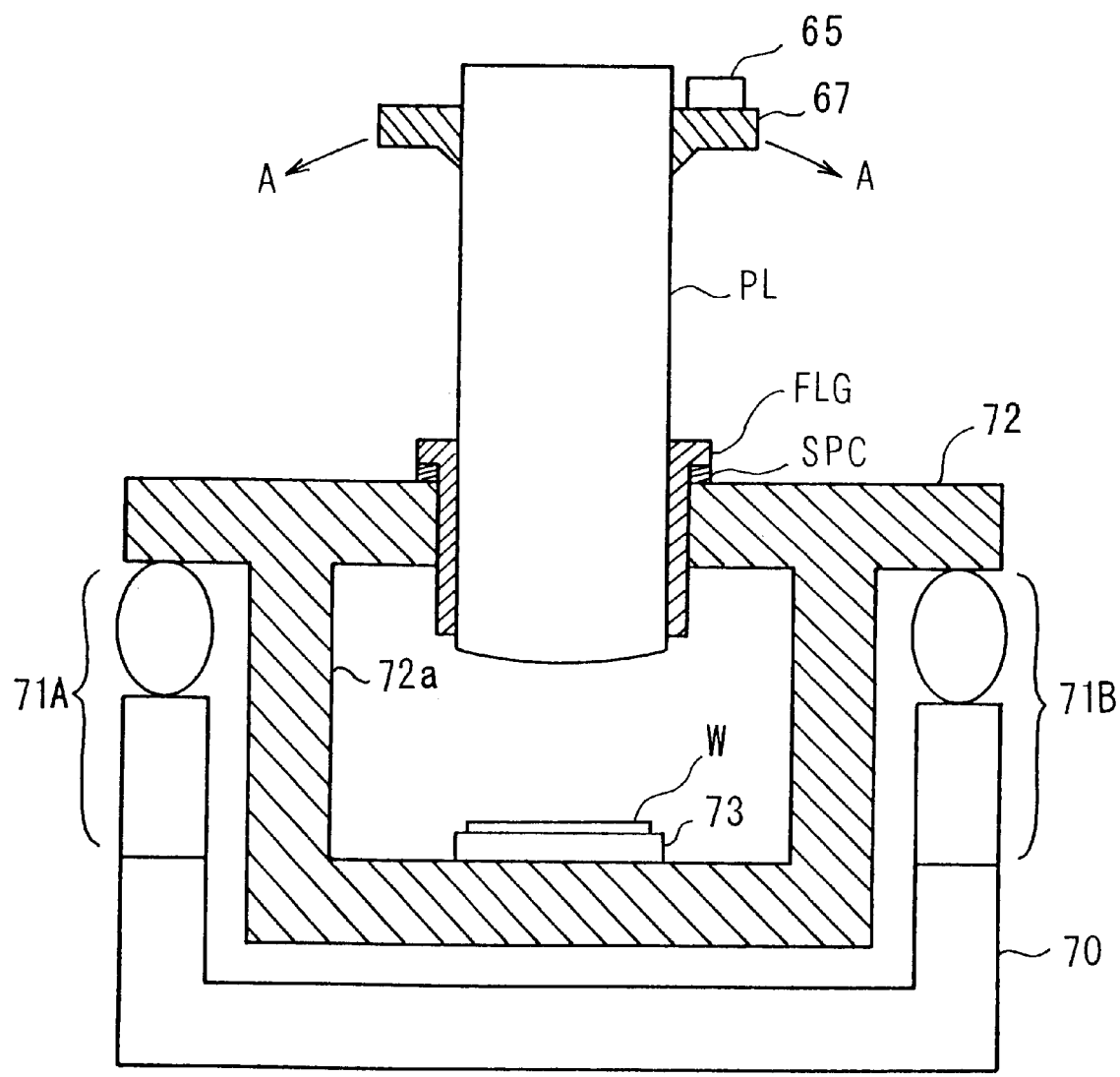
FIG. 6 is a figure for explanation of an example in which the vibration cancellation apparatus is affixed to a projection optical system.

Referring to FIG. 6 which shows a sketch of the main portions of an exposure apparatus, the four corners of a base table 72 are set up upon a base frame 70 via respective vibration isolation units or vibration proof units 71A through 71D (however, the vibration proof units 71C and 71D are not shown because they are located behind the plane of the drawing paper). A substrate stage 73 is set up upon a lower frame 72*a* which is hung from the lower portion of the base table 72. The wafer W is carried upon the substrate stage 73.

A projection optical system PL is fixed upon the base table 72 via a spacer SPC and a flange FLG. A flange shaped member 67 is fixed to the upper portion of the projection optical system PL, and a vibration cancellation unit 65 is fixed upon this member 67.

In the above described exposure apparatus, portions other than those described above are of identical structure to the exposure apparatus shown in FIG. 1, and accordingly explanations and figures relating to them are curtailed.

For the exposure apparatus shown in FIG. 6, the case when vibration is generated in the base table 72 due to acceleration or deceleration action or the like of the substrate stage 73 will now be explained. If this vibration is of comparatively low frequency, the projection optical system PL, the base table 72, and the lower frame 72a and so on vibrate together as one body. In the following the case in which the portions which are supported by the vibration isolation units 71A through 71D vibrate together as one body will be termed the rigid mode of vibration. While the rigid mode of vibration is being generated, the relative positional relationship of the projection optical system PL and the wafer W is kept constant. Accordingly, the rigid mode of vibration exerts little influence upon the accuracy of the pattern formed upon the wafer W.

By contrast, in the case that the above-described vibration is of comparatively high frequency, relative vibration is generated in the projection optical system PL with respect to the base table 72, as shown by the arrow A in FIG. 6. When this type of vibration is generated, the relative positions of the projection optical system PL and the wafer W vary. In the following, vibration causing relative displacement generated in the portion which is supported by the vibration isolation units 71A through 71D will be termed the resilient mode of vibration. While the resilient mode of vibration is being generated, the influence exerted upon the accuracy of the pattern formed upon the wafer W becomes impossible to ignore.

The vibration cancellation apparatus 65 is provided in order to suppress the resilient mode vibrations generated in the projection optical system PL.

Figure 7A:
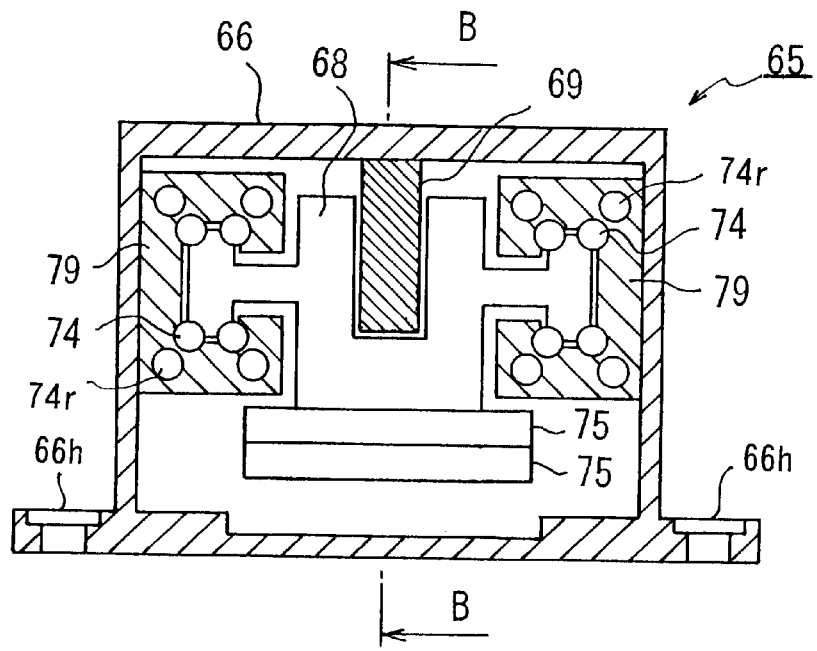
FIG. 7A is a cross sectional figure showing the internal structure of a vibration cancellation apparatus whose construction has been unitarized.
Figure 7B:
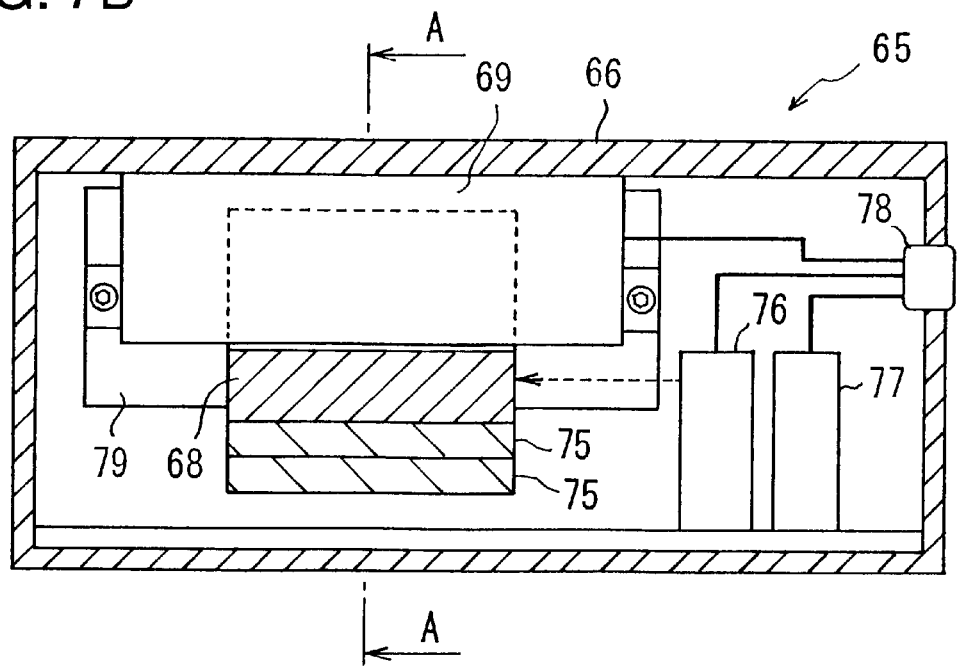
FIG. 7B is a figure showing a different cross section of this vibration cancellation apparatus.

The internal structure of the vibration cancellation apparatus 65 will now be explained with reference to FIG. 7A and FIG. 7B. FIG. 7A shows a cross section A—A of FIG. 7B, while FIG. 7B shows a cross section B—B of FIG. 7A. The vibration cancellation apparatus 65 is covered over by a cover 66, and is fixed to the member 67 shown in FIG. 6 by bolts which pass through holes 66h provided in the bottom portion of the cover 66.

Referring to FIG. 7A, a stator 69 and a pair of straight motion guides 79 are fixed to the internal portion of the cover 66. A moving magnet 68 which is supported by these straight motion guides 79 can move in the perpendicular direction to the plane of the drawing paper with respect to the stator 79. Two weights 75 are attached to the lower portion of the moving magnet 68. The number and the weights of these attached weights 75 can be increased or decreased. In other words, the vibration cancellation apparatus 65 is a construction which has general applicability, and the reaction generated in the stator 69 when the moving magnet 68 is moved with a predetermined acceleration can be adjusted according to the mass and the moment of inertia and the like of the vibration cancellation object or countermeasures.

The straight motion guides 79 have C-shaped cross sections as shown in FIG. 7A, and four series of balls 74 are provided internally to them, extending in the direction perpendicular to the plane of the drawing paper. The balls which constitute these four series of balls 74 are recirculated through respective return tubes 74r. It should be noted that, in FIG. 7A, reference symbols are affixed to only one of the ball series 74 and return tubes 74r within the respective straight motion guides 79 fixed left and right of the cover 66.

As shown in FIG. 7B, a displacement sensor 76 and an acceleration sensor 77 which serves as a vibration sensor are fixed within the vibration cancellation unit 65. The displacement sensor 76 outputs a signal according to the magnitude of the relative distance between this displacement sensor 76 and the moving magnet 68. The acceleration sensor 77 outputs a signal according to the magnitude of the vibration (acceleration) transmitted to within the vibration cancellation unit. The signals output from the displacement sensor 76 and the acceleration sensor 77 are output to a vibration cancellation control circuit which is connected via a connector 78. Further, electrical current for driving the moving magnet 68 is supplied from the vibration cancellation control circuit via the connector 78 to a coil in the stator 69. The moving magnet 68 generates thrust proportional to the value of the electrical current supplied to the coil in the stator 69.

As explained above, the vibration cancellation apparatus 65 of this embodiment is constructed as a unit, by its main structure—consisting of the moving magnet 68 and the stator 69 which constitute the linear motor, the weights 75, the displacement sensor 76, the acceleration sensor 77 and so on —being supported inside the cover 66. Further, since the cover 66 is arranged to be fixed by the above-described bolts to the vibration cancellation object (the member 67), therefore it is possible easily to fix and remove the vibration cancellation apparatus 65 to and from the vibration cancellation object. Since as explained above it is possible to adjust the masses of the weights 75, accordingly it is possible to vary the masses of the weights 75 according to the setup position of the vibration cancellation apparatus 65 (the vibration cancellation object). Accordingly, the vibration cancellation apparatus 65 of this embodiment can easily be fitted at all types of points at which suppression of vibrations is considered necessary.

The vibration cancellation control circuit connected to the vibration cancellation apparatus 65 via the connector 78 will now be explained with reference to FIG. 8A, FIG. 8B, and FIG. 8C.

Figure 8A:
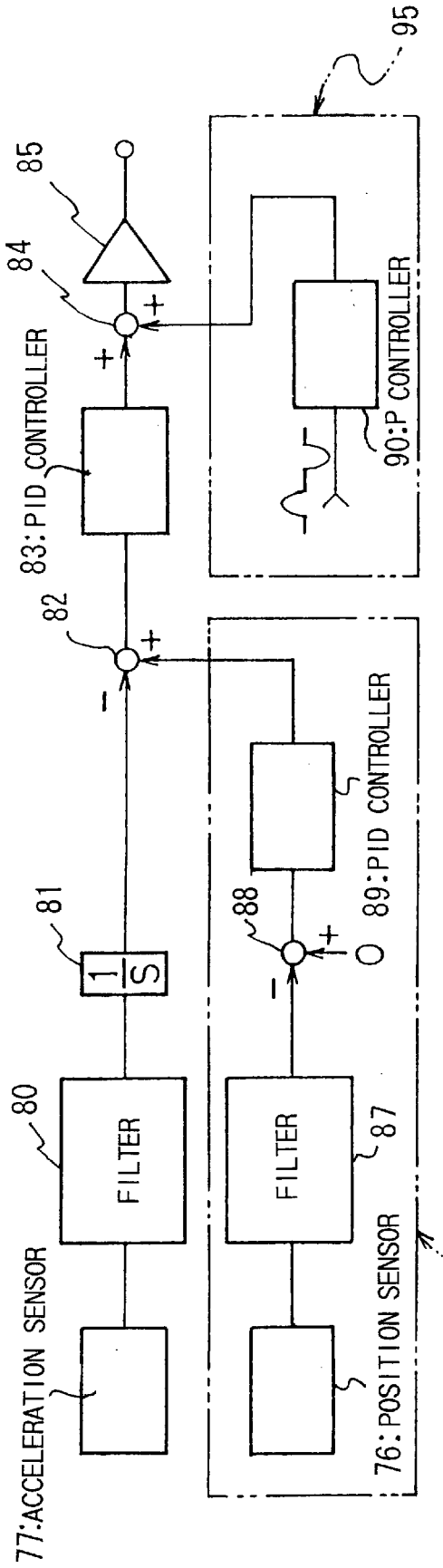
FIG. 8A is a block diagram for explanation of overall vibration cancellation control circuit.
Figure 8C:
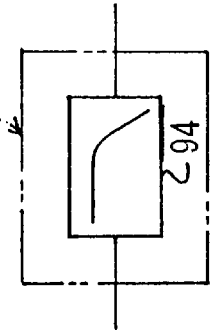
FIG. 8B and FIG. 8C are figures for explanation of the internal structure of a filter.

Referring to FIG. 8A, the signal output from the acceleration sensor 77 is filtered by a filter 80. The signal which has been filtered by the filter 80 is integrated by an integrator 81 and is converted into a speed signal, and is inputted into an adder 82. The signal output from the position sensor 76 is filtered by a filter 87. The signal which has been filtered by the filter 87 is input into an adder 88. Further, a control target value of zero is inputted into the adder 88. A PID controller 89 outputs a speed command signal to the adder 82, based upon a position deviation signal output from the adder 88.

A PID controller 83 determines the thrust value which should be generated by the moving magnet 68, based upon the signal output from the adder 82. The PID controller 83 outputs a signal to an adder 84 related to the thrust value which has been determined.

A feed forward signal according to the acceleration or deceleration action etc. of the wafer stage 73 shown in FIG. 6 is input to a P controller 90 for proportional control. The P controller 90 determines the thrust value which should be generated by the moving magnet 68 based upon the feed forward signal, and outputs a signal to the adder 84 related to this thrust value. The signal output from the adder 84 is voltage amplified by an amp 85, and is applied to a coil of the stator 69 via the connector 78 shown in FIG. 7B.

An example of the structure of the filter 80 will now be explained with reference to FIG. 8B. In the exposure apparatus according to this embodiment, it will be supposed that the projection optical system PL, when vibrating in the resilient mode, has a resonant frequency at approximately some frequency E (Hz) previously determined by experiment. Further, as has been previously explained, the influence which vibration in the rigid mode exerts upon the accuracy of the pattern formed upon the wafer W is small. For the exposure apparatus according to this embodiment, the frequency of the vibration in the rigid mode is less than 10 Hz.

In view of the above facts, the filter 80 includes a high pass filter 91, a bandpass filter 92, and a low pass filter 93. That is, frequency components of bands below for example a predetermined value A (Hz) are filtered out by the high pass filter 91 and are eliminated or reduced. And frequency components of bands below a predetermined value BHz (>AHz) and frequency components of bands above a predetermined value CHz (>BHz) are filtered out by the bandpass filter 92 to be eliminated or reduced. Further, frequency components of bands above a fixed value DHz (>CHz) are filtered out by the low pass filter 93 to be eliminated or reduced.

Figure 8B:
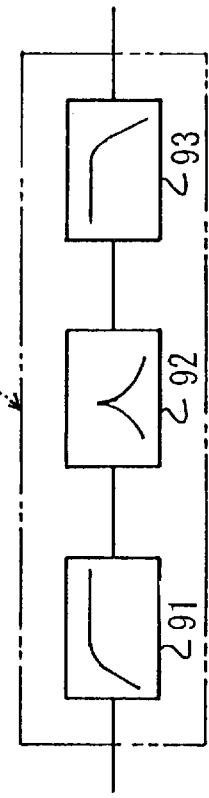

In the structure of the filter 80 shown in FIG. 8B, the reason for using the high pass filter 91 and the low pass filter 93 as well as the bandpass filter 92 is in order to obtain the beneficial effect in the present embodiment of obtaining a more sharp band filtration characteristic.

The filter 80 might also be made with any one of the above described three filters, according to the response characteristics of the acceleration sensor and the frequency band of the vibrations for which vibration cancellation operation is required and the like, or might be structured to include any number thereof. Moreover, it is not absolutely essential to use the filter 80.

An example of the structure of the filter 87 will now be explained with reference to FIG. 8C. The filter 87 is constituted by a low pass filter 94. The reason for using the low pass filter 94 is in order to set the position control responsiveness of the PID controller 89 comparatively low, as is also explained for the first embodiment. That is, if the position control responsiveness of the PID controller 89 is high, there is a danger that the speed will increase when the moving magnet 68 returns to the neutral position, and conversely of undesirably increasing the vibration of the projection optical system PL. It is effective to change the filtration characteristic for the filter 87 as well, according to the vibration level required for the vibration cancellation object. Or it would also be acceptable to set the gain of the PID controller 89 low, without using any filter 87.

The efficacy of vibration suppression by the vibration cancellation apparatus constructed as above will now be described with reference to FIG. 9, FIG. 10, FIG. 11A, FIG. 11B, FIG. 12A, and FIG. 12B.

Figure 9:
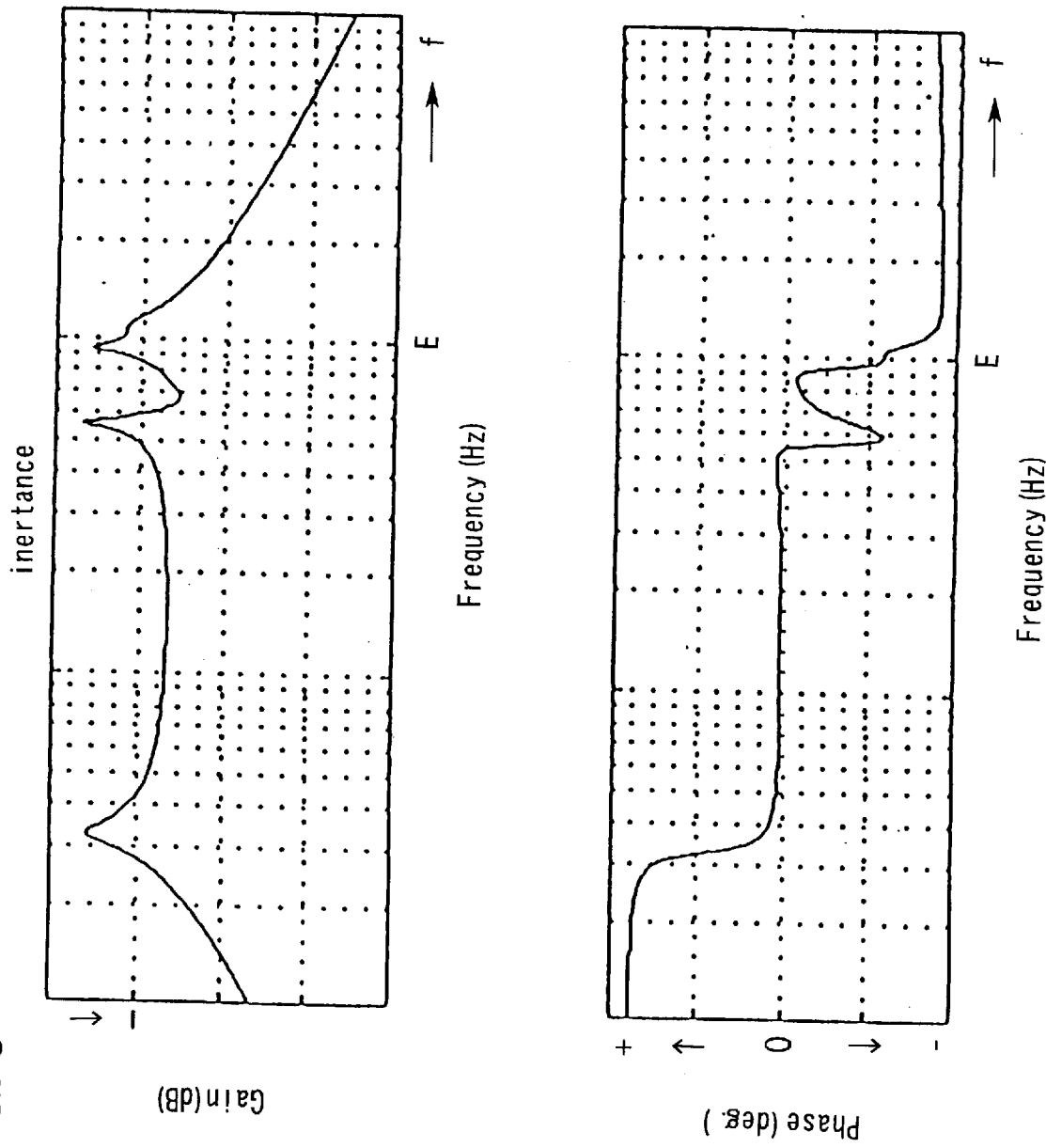
FIG. 9 is a figure showing the inertance of a projection lens of an exposure apparatus equipped with a vibration cancellation apparatus according to the present invention.
Figure 10:
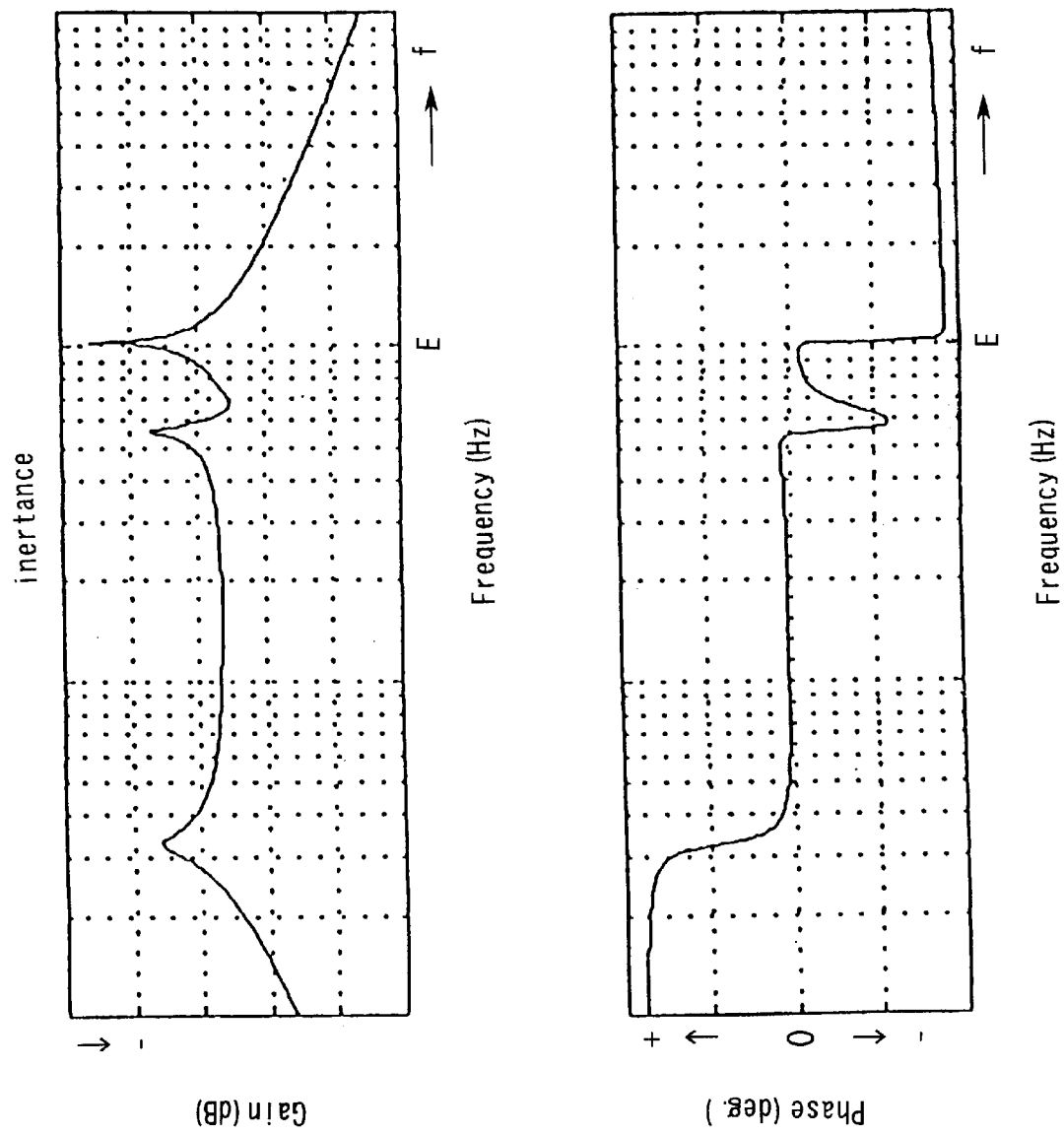
FIG. 10 is a figure showing the inertance of a projection lens of an exposure apparatus according to the prior art.

FIG. 9 and FIG. 10 show the inertance characteristics of the projection lens PL for the exposure apparatus shown in FIG. 6. FIG. 9 shows the characteristic in the case that a vibration cancellation apparatus according to the embodiment of the present invention is equipped, while FIG. 10 shows the characteristics if it is not equipped. As will be clear if FIG. 9 and FIG. 10 are compared, in the vicinity of the frequency E (Hz) the gain is greatly suppressed by the vibration cancellation apparatus.

Figure 11A:
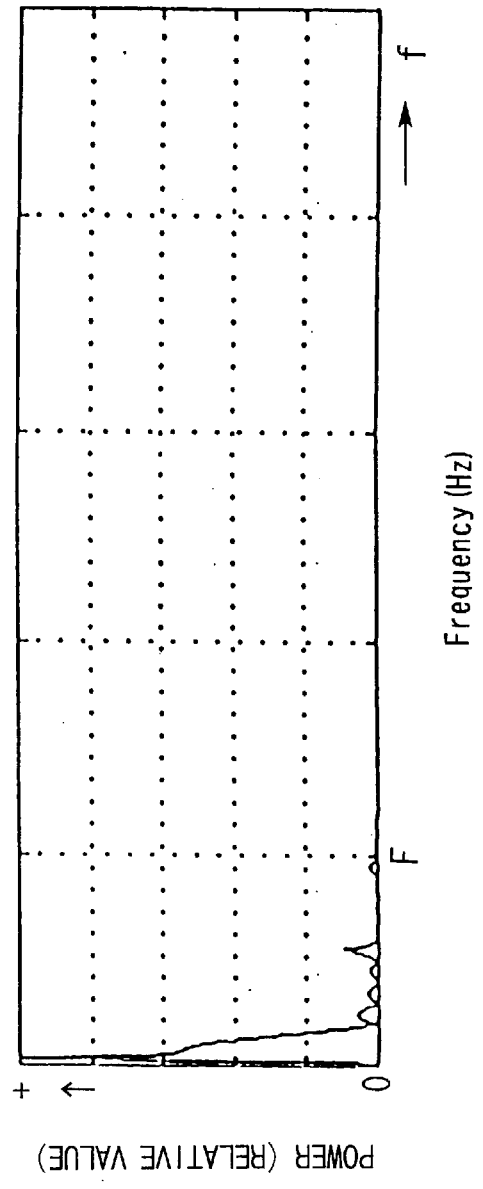
FIG. 11A is a figure showing the vibration spectrum of a projection lens of an exposure apparatus equipped with a vibration cancellation apparatus according to the present invention.
Figure 12A:
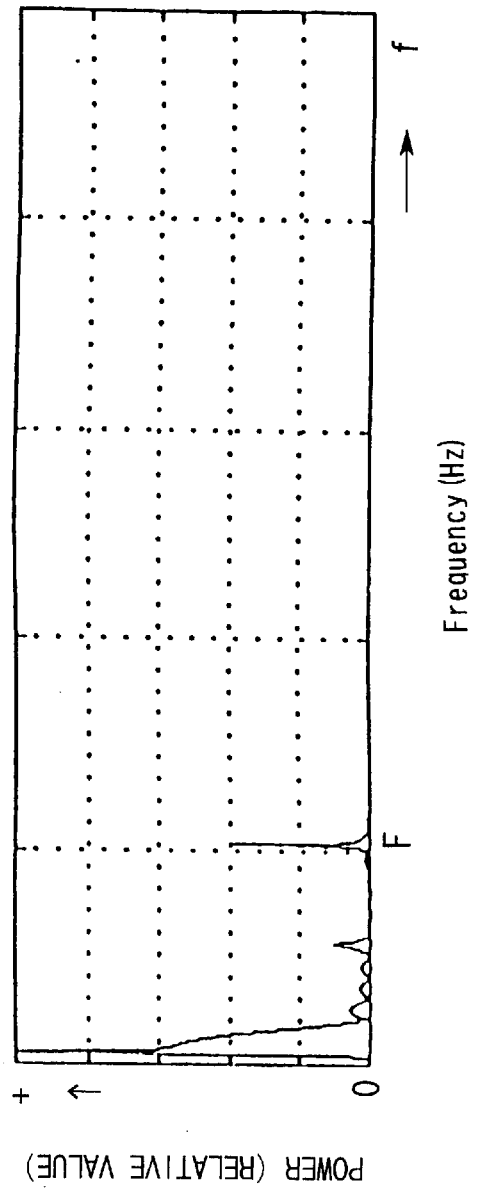
FIG. 12A is a figure showing the vibration spectrum of a projection lens of an exposure apparatus according to the prior art.

FIG. 11A and FIG. 12A are graphs showing the spectrum of the vibrations generated in the projection lens PL. FIG. 11A shows the characteristic in the case that a vibration cancellation apparatus according to the embodiment of the present invention is equipped, while FIG. 12A shows the characteristics if it is not equipped. The vibration spectrum present in the vicinity of the frequency F (Hz) in the graph of FIG. 12A is not present in the graph of FIG. 11A. In other words, it will be understood that the vibration spectrum in the vicinity of F (Hz) for vibrations generated in the projection optical system PL is reduced by the vibration cancellation apparatus according to the embodiment of the present invention.

Figure 11B:
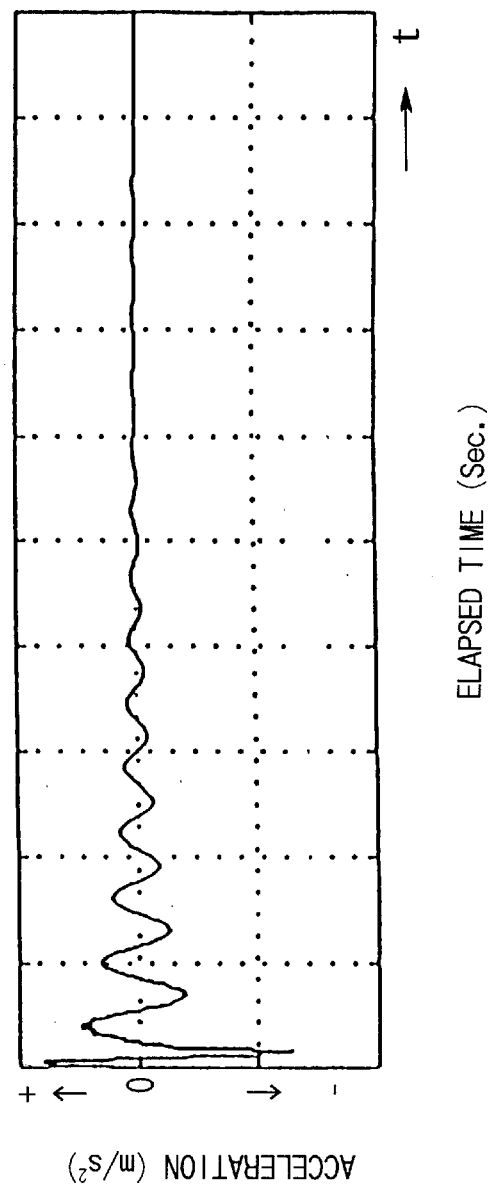
FIG. 11B is a figure showing the transition characteristics of vibration generated in a projection lens of an exposure apparatus equipped with a vibration cancellation apparatus according to the present invention.
Figure 12B:
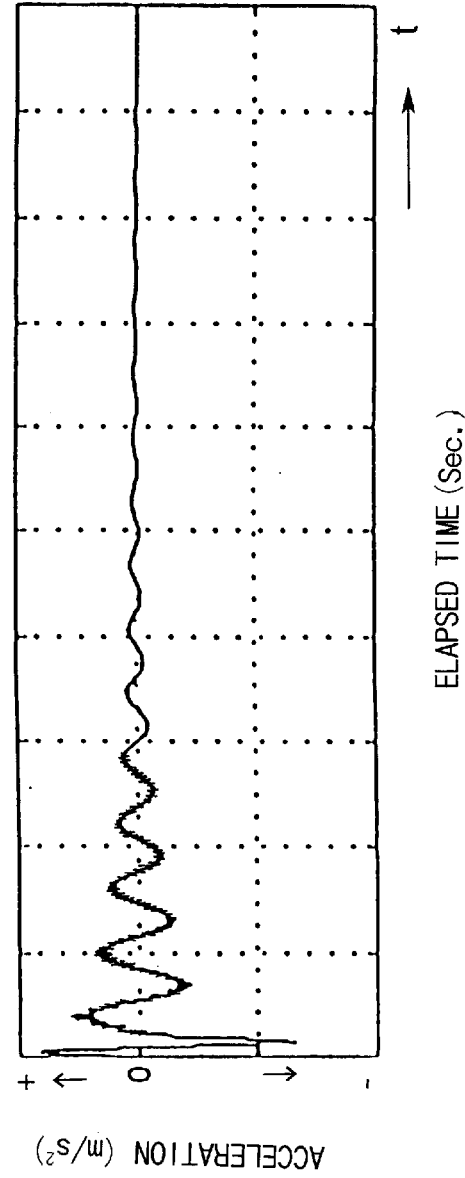
FIG. 12B is a figure showing the transition characteristics of vibration generated in a projection lens of an expose apparatus according to the prior art.

FIG. 11B and FIG. 12B show the vibration attenuation transition characteristics when some additional vibration force acts upon the projection optical system PL. And FIG. 11B shows the characteristic in the case that a vibration cancellation apparatus according to the embodiment of the present invention is equipped, while FIG. 12B shows the characteristics if it is not equipped. In the graph of FIG. 12B, it will be understood that comparatively fine vibrations, i.e. vibrations in the resilient mode are superposed upon comparatively slow vibrations, i.e. vibrations in the rigid mode.

As described the above, comparatively slow vibrations are vibrations in the rigid mode, and it is not necessary to wait for them to be abated. By contrast, comparatively fine vibrations are vibrations in the resilient mode, and it is necessary to wait for them to be abated. Accordingly, it becomes possible to enhance throughput with the embodiment of the present invention.

Figure 13:
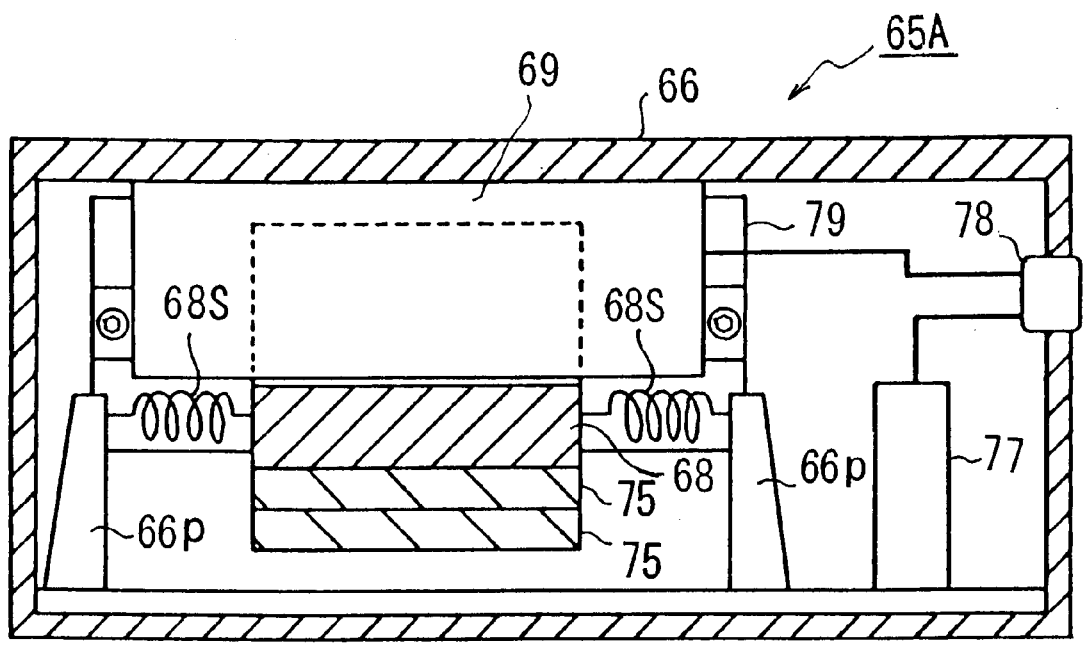
FIG. 13 is a figure showing an example of another vibration cancellation apparatus whose construction has been unitarized.

FIG. 13 shows a case in which the position sensor 76 of the vibration cancellation apparatus shown in FIG. 7A and FIG. 7B has become necessary. In FIG. 13, a pair of spring hangers 66p are provided inside the vibration cancellation apparatus 65A upon a line substantially parallel to the direction of movement of the moving magnet 68. Between these two spring hangers 66p and the ends of the moving magnet 68 which are apart in the movement direction thereof, respective springs 68S are attached. The moving magnet 68 is positioned by the spring balance of the two springs 68S in a neutral position, in other words almost at the center of the movement stroke of the moving magnet 68. The other structural elements are identical to those shown in FIG. 7B, and therefore the same reference symbols are affixed as in FIG. 7B, and the explanation thereof is curtailed.

When vibration cancellation control is performed using the vibration cancellation apparatus 65A shown in FIG. 13, the position control feedback loop 94 of FIG. 8A is not required. In this case, it will be acceptable to input zero as a control target value into the adder 82, instead of the output signal from the PID controller 89.

It should be noted that it will be acceptable to use a vibration cancellation control circuit of a structure which does not comprise the feed forward control block 95 shown in FIG. 8A, in the case of using the vibration cancellation apparatus 65A as well as in the case of using the vibration cancellation apparatus 65.

In the above the reduction of vibration of the projection optical system PL in the horizontal direction has been explained by way of example. Instead of this, it is possible to reduce torsional vibration of the projection optical system PL around the optical axis. In the case of reducing this torsional vibration, a plurality of vibration cancellation apparatus 65 or 65A should be disposed around the circumference of the optical axis of the projection optical system. At this time, it is proper to determine the directions of emplacement of these vibration cancellation apparatus 65 or 65A so as to generate a couple in the direction to reduce the above described torsional vibration by reaction generated from the above described plurality of vibration cancellation apparatus 65 or 65A.

Embodiment 3

In the first and second embodiments described above the vibration cancellation apparatus is for suppressing vibrations in one or another horizontal direction. The vibration cancellation apparatus according to the present invention not only can suppress vibrations in the horizontal direction,-but can also suppress vibrations in the vertical direction.

Figure 14A:
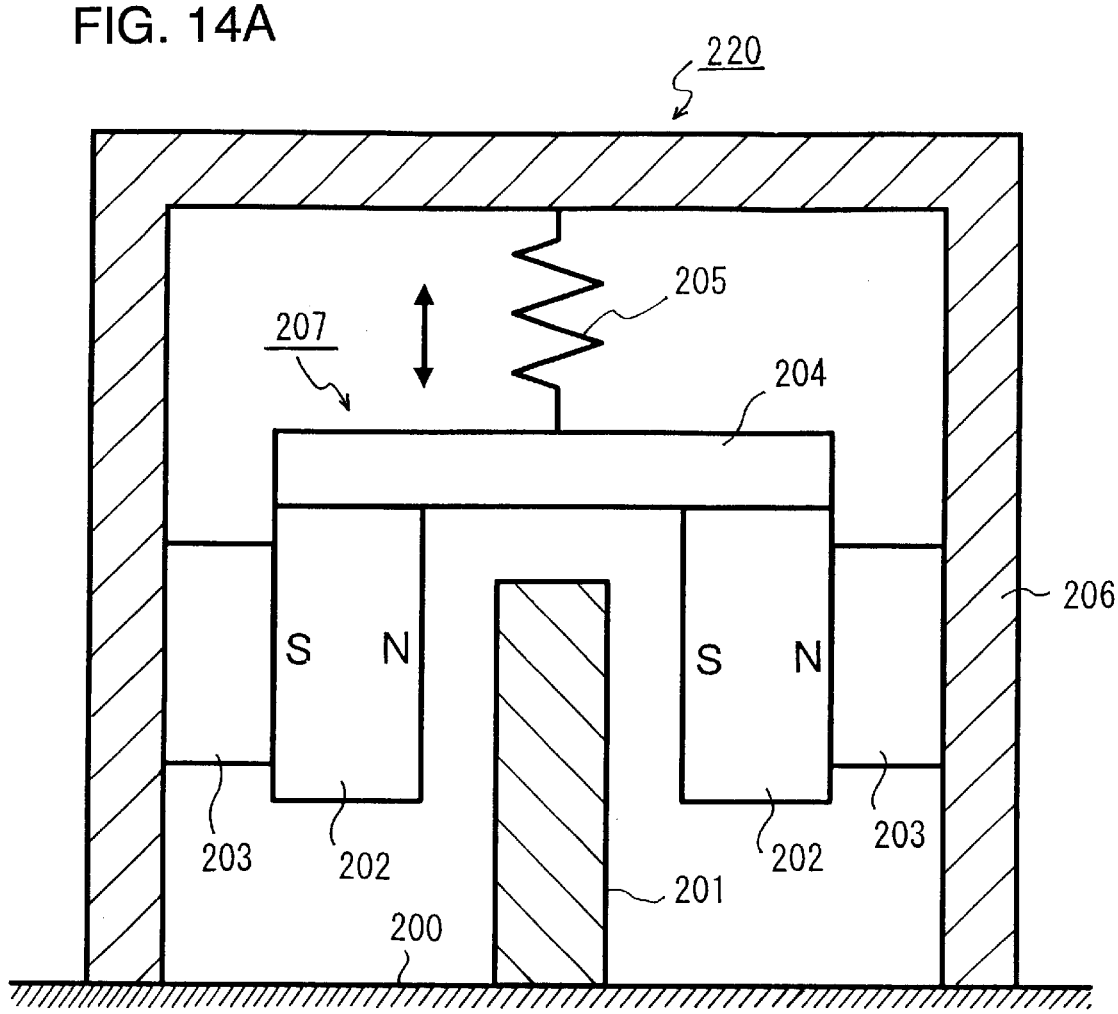
FIG. 14A is a figure for explanation of an example of the vibration cancellation apparatus according to the present invention which is used for suppressing vibration in the vertical direction.
Figure 14B:
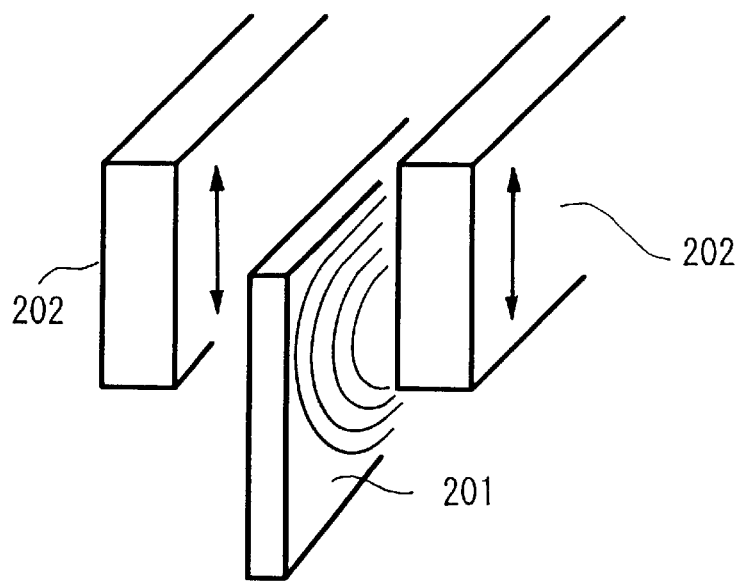
FIG. 14B is a figure for explanation of the structure of a stator and of the manner of mutual movement between a permanent magnet and the stator.

In FIG. 14A there is shown an example of the construction of a vibration cancellation apparatus which is fixed to a vibration cancellation object or countermeasures 200. A stator 201 and a cover 206 are fixed to the vibration cancellation object 200. A moving magnet 207 comprises a weight 204 and two permanent magnets 202, and is guided by air bearings 203 so as to be movable in the upward and downward direction in FIG. 14A, i.e. in the vertical direction. As shown in FIG. 14B, the stator 201 comprises a coil. An attractive or a repulsive force in the direction of gravity between the stator 201 and the moving magnet 207 is generated by supplying electrical current to this coil. In other words, the moving magnet 207 and the stator 201 constitute a linear motor. It should be noted that in the following explanation it is assumed that the mass of the two permanent magnets 202 is included in the mass m of the weight 204.

The moving magnet 207 is suspended by a spring 205. When no electrical current is supplied to the coil of the stator 201, the relative position of the moving magnet 207 and the stator 201 is determined based upon the weight of the moving magnet 207 and the spring constant of the spring 205.

The vibration cancellation apparatus 220 shown in FIG. 14A can be driven by a device structured identically to the vibration cancellation control device shown in FIG. 8A (however, the portions for the position control feedback loop 94 being excepted).

Further, with the vibration cancellation apparatus shown in FIG. 14A, it is possible to cause excitation of coupled vibrations between the vibration cancellation object and the moving magnet 207 by adjusting the mass of the moving magnet 207 and the spring constant of the spring 205. Causing excitation of coupled vibrations in this manner is also efficacious for vibration suppression for the vibration cancellation object 200. At this time, it is also possible to use the above-described linear motor as a damper with variable damping force by adjusting the amount of electrical current supplied to the coil of the stator 201. In other words, it is possible to constitute a dynamic damper which can suppress vibrations of the vibration cancellation object across a wide frequency band of vibrations by adjusting the amount of electrical current supplied to the coil of the stator 201 according to vibration of the vibration cancellation object as detected by the acceleration sensor.

Figure 15A:
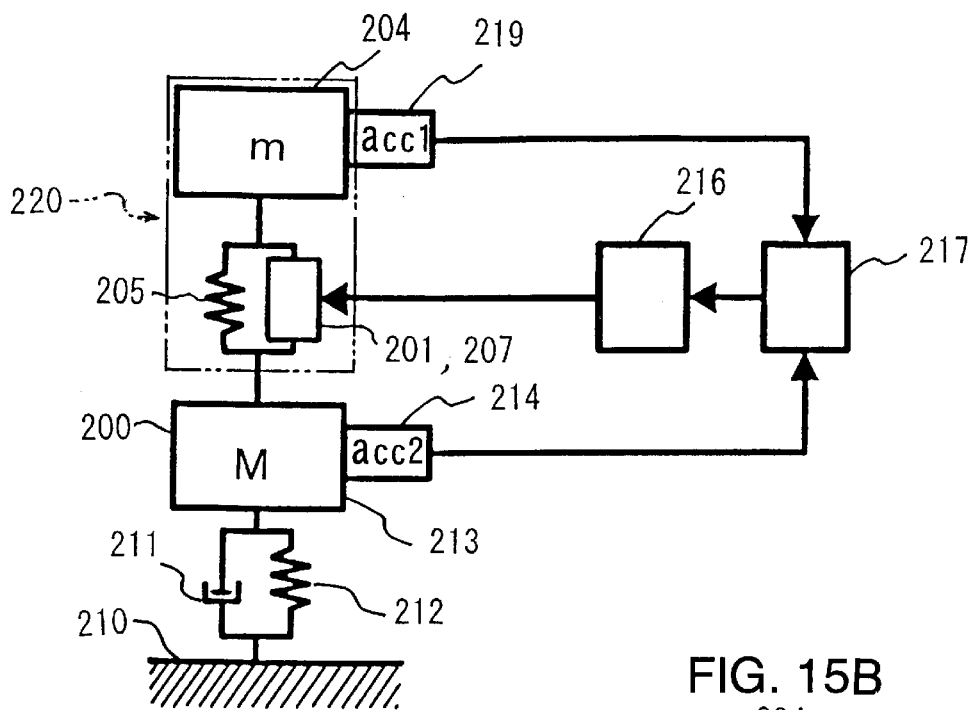
FIG. 15A is a figure for explanation of another example of the vibration cancellation apparatus according to the present invention which is used for suppressing vibration in the vertical direction.
Figure 15B:
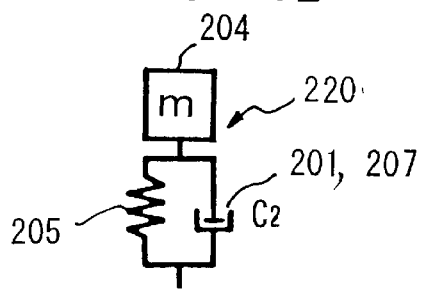
FIG. 15B is a figure showing an equivalent vibration model of the vibration cancellation apparatus and FIG. 15C is a block diagram showing the structure of a vibration cancellation control circuit which is used together with the vibration cancellation apparatus shown in FIG. 15A.

When the vibration cancellation apparatus 220 is used as described above, this vibration cancellation apparatus 220 can equivalently be shown by modeling as shown in FIG. 15B. That is to say, the spring 205 and the stator 201 and the moving magnet 207 which act as a damper with variable damping ratio are interposed between the weight 204 and the vibration cancellation object 200. Furthermore the spring 205 is connected in parallel with the stator 201 and the moving magnet 207. From FIG. 14A, it is likely that the spring 205, the stator 201 and the moving magnet 207 are connected in series between the weight 204 and the vibration cancellation object 200. However, if it is hypothesized that in FIG. 14A the attractive force between the moving magnet 207 and the stator 201 becomes infinitely great, in other words if the moving magnet 207 and the stator 201 are fixed together, then the weight 204 and the vibration cancellation object 200 are rigidly connected together. As is clear from this matter, the vibration cancellation apparatus 220 can be equivalently modeled as shown in FIG. 15B.

In the above explanation the vibration cancellation apparatus according to the embodiment of the present invention is one which controlled the drive force of a linear motor based upon the signal output from an accelerometer provided to the vibration cancellation object, and which drove a weight in the direction to quell vibrations of the vibration cancellation object. In contrast to this, as explained below, it is possible to provide acceleration sensors to both vibration cancellation object and also to the weight.

FIG. 15A shows vibration modeling for the vibration cancellation control device 220 and the vibration cancellation object 200. In FIG. 15A, a damper 211 and a spring 212 are interposed between the vibration cancellation object 200 and the ground contact surface 210, and a stator 201, a moving magnet 207 and a spring 205 are interposed between the vibration cancellation object 200 and the weight 204. Thrust (drive force) is generated by the actuator constituted by this stator 201 and moving magnet 207, which causes relative movement between the vibration cancellation object 200 and the weight 204. And, along with fixing an accelerometer 214 to the vibration cancellation object 200, an accelerometer 219 is fixed to the weight 204. Both the accelerometers 214 and 219 are connected to the vibration cancellation control circuit 217. A thrust command signal output from the vibration cancellation control circuit 217 is converted into a power by a driver 216 and the power is applied to the coil of the stator 201.

Figure 15C:
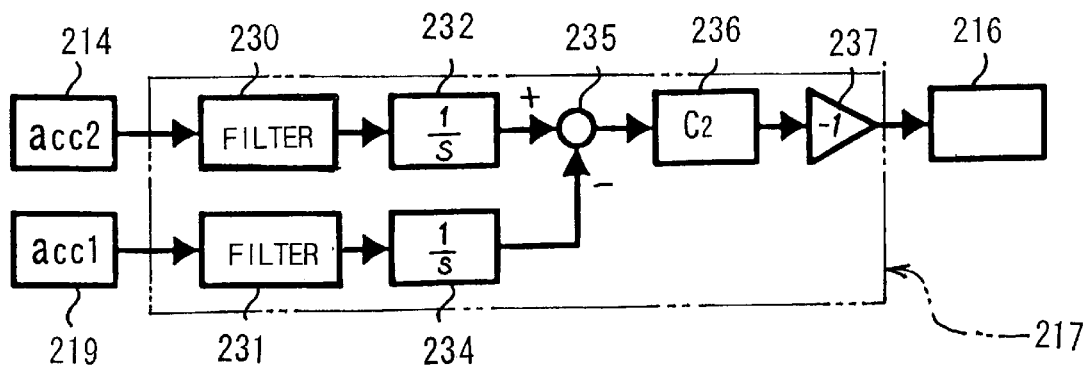

FIG. 15C is a block diagram for explanation of the structure of the vibration cancellation control circuit 217. A signal output from an accelerometer 214 which is fixed to the vibration cancellation object 200 is filtered by a filter 230, and a signal corresponding only to vibrations in the frequency band for which vibration cancellation countermeasures are to be instituted is input to an integrator 232.

A signal output from an accelerometer 219 which is fixed to the weight 204 is filtered by a filter 231, and a signal corresponding only to vibrations in the frequency band for which vibration cancellation object are to be instituted is input to an integrator 234. The filter 231 has the same function as the filter 230. With this embodiment, the peak value of vibrations is reduced by coupled vibrations occurred between a first system made up from the vibration cancellation object 200, the damper 211 and the spring 212 and a second system made up from the weight 204, the moving magnet 207 and the spring 205. Accordingly, the filter 230 and the filter 231 are set so as to perform filtration in accordance with the frequencies of the signals output from the accelerometers 214 and 219 which it is desired to eliminate.

The signals output from the integrators 232 and 234 are added by an adder 235 and are input to a controller 236. The controller 236 calculates the thrust which should be generated between the stator 201 and the moving magnet 207, based upon the signal output by the adder 235, and outputs a command value corresponding to this thrust. The command value output by the controller 236 is imparted with minus gain by an inverting amplifier 237, and is output to the driver 216. The result of this is that electrical power is supplied from the driver 216 to the coil of the stator 201 so that thrust is generated between the stator 201 and the moving magnet 207 and the vibrations of the vibration cancellation object 200 are quelled.

Moreover, in the structure of FIG. 15C, it would also be acceptable to modify the construction so as to quell the vibrations by inputting the output of the controller 236 directly to the driver 216, without providing the inverting amplifier 237.

Further, since with this embodiment it is possible to obtain the difference between the signal output from the accelerometer 214 and the signal output from the accelerometer 219, thereby the controller 236 is able to maintain the coupling of vibrations generated between the vibration cancellation object 200 and the moving magnet 207 (the vibration cancellation apparatus 220) in a predetermined state by using the value of the above described difference. By doing this, it is possible to reduce the peak of the vibration of the vibration cancellation object, and it becomes possible quickly to abate the vibration.

Further, as with the second embodiment, it is beneficial to make the vibration cancellation apparatus as a unit by integrating together the actuator which comprises the stator 201 and the moving magnet 207 and the accelerometers 214 and 219. In this case, in the same manner as with the second embodiment, it is beneficial to make it possible to adjust the mass of the weight 204.

The vibration cancellation apparatus explained above with reference to FIG. 14A and FIG. 15A can also be used when suppressing vibrations of the vibration cancellation object generated in the horizontal direction. Furthermore, it is also possible to suppress vibrations in a plurality of directions generated in the vibration cancellation object, by using an appropriate combination of vibration cancellation apparatus as explained in the above with regard to the first through the third embodiments.

Further, although in the second embodiment the actuators and sensors for vibration cancellation are integrated together, so that the vibration cancellation apparatus can be unitized, it is also possible to include the vibration cancellation control circuit within this unit.

By setting up the vibration cancellation apparatus described above at an appropriate place within the exposure apparatus, it is possible efficaciously to suppress vibrations set up within the exposure apparatus. This will be explained in the following with reference to FIG. 16.

Figure 16:
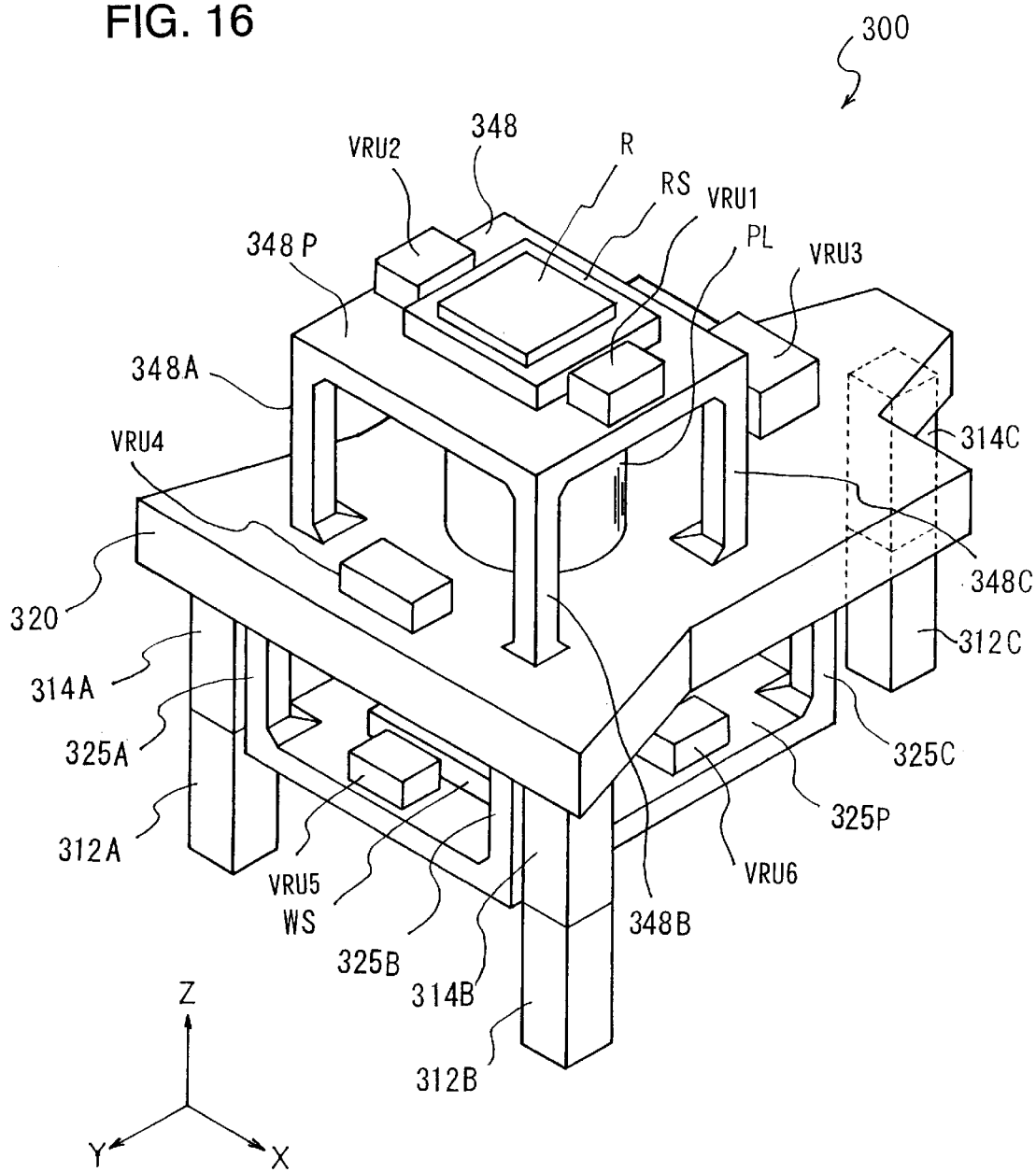
FIG. 16 is a figure for explanation of an exposure apparatus equipped with a vibration cancellation apparatus according to the present invention.

In FIG. 16 there is shown a summary of an exposure apparatus 300 in which a vibration cancellation apparatus according to the second or the third embodiment is set up. In FIG. 16, the Z-axis is taken parallel to the optical axis of the projection optical system PL, the X-axis is taken in a plane perpendicular to the Z-axis and parallel to the direction of the base of a triangular shaped base table 320, and the Y-axis is taken in a direction perpendicular thereto. Furthermore, according to requirements, it will be assumed in the following explanation that the shown directions of the arrows which indicate the X, Y, and Z axes in FIG. 16 will be used for specifying the +X, +Y, and +Z directions, while the opposite directions to these will be used for specifying the −X, −Y, and −Z directions.

With the exposure apparatus explained in the first embodiment, as shown in FIG. 1 the square base table 31B is A supported by the four vibration proof units 47A, 47B, 47C, and 47D.

By contrast, the base table 320 of the exposure apparatus 300 shown in FIG. 16 has a roughly triangular shape, and is supported by three VCMs 312A through 312C and air mounts 314A through 314C. And the base table 320 is arranged so as to position the base portion of the above-described triangular shape at the front of the device.

Although the VCMs 312A, 312B and 312C and the air mounts 314A, 314B and 314C are being explained, they will herein be explained as "VCM 312" and "air mount 314", since each of these VCMs 312A, 312B and 312C and each of these air mounts 314A, 314B and 314C is of identical structure.

The VCM 312 comprises fixed elements and movable elements and the like, and generates thrust in the Z direction according to a voltage which is supplied to it from a control section not shown in the figure. The air mount 314 generates thrust in the Z direction according to air pressure supplied from an air pressure source not shown in the figure. This VCM 312 and air mount 314 are connected in series and support the base table 320. Vibration transmitted to the base table 320 from the surface of the foundation floor is reduced by the above structure.

Columns 348 are fixed on top of the base table 320, while a lower base 325 is fixed underneath it. Although not so shown in FIG. 16, the exposure apparatus 300 comprises a reaction frame which discharges or releases reactions generated in accompaniment with the acceleration and deceleration action of the reticle stage RS to the surface of the foundation floor on which the exposure apparatus 300 is installed. In the same manner, the exposure apparatus 300 comprises a reaction frame which discharges reactions generated in accompaniment with the acceleration and deceleration action of the wafer stage WS to the surface of the foundation floor on which the exposure apparatus 300 is installed.

As shown in FIG. 16, vibration cancellation apparatus VRU1 through VRU6 are fixed at appropriate portions upon the members which make up the exposure apparatus 300. The same devices as were described for the second and the third embodiments may be used as these vibration cancellation apparatus VRU1 through VRU6. Or it would also be acceptable to combine in one vibration cancellation apparatus a plurality of vibration cancellation apparatus for making it possible to suppress vibrations in the directions of two mutually perpendicular axes (for example the Y and Z directions) or in three directions (for example the X, Y, and Z directions).

The exposure apparatus 300 according to the above described structure, along with isolating vibrations transmitted from the surface of the foundation floor by the VCMs 312A, 312B, 312C and the air mounts 314A, 314B, and 314C, is able to reduce the generation of vibrations in the base table 320, the columns 348 and the lower base 325 by discharging or releasing reactions generated when the wafer stage WS and the reticle stage RS repeatedly stop and start to the surface of the foundation floor.

However, even with the structure explained above, it may happen that small vibrations are generated in the exposure apparatus 300 or remain behind, and sometimes these vibrations deteriorate the accuracy of exposure. The following are representative primary factors which cause the generation of small vibrations.

One of them is that, as has already been explained, vibrations are transmitted to the surface of the foundation floor via the reaction frame, and these vibrations are transmitted to the VCMs 312A, 312B, 312C and the air mounts 314A, 314B, and 314C. These vibrations are not wholly intercepted by the VCMs 312A, 312B, 312C and the air mounts 314A, 314B, and 314C, but generate small vibrations in the base table 320.

Another factor is that the center of gravity position of the main body of the exposure apparatus 300 changes as the wafer stage WS and the reticle stage RS move. Tilting of the exposure apparatus 300 caused as an accompaniment of variation of this center of gravity position is reduced by the VCMs 312A, 312B, 312C and the air mounts 314A, 314B, and 314C, but it can happen that small vibrations may be generated at this time. These vibrations may become a problem, due to the accuracy demanded from the exposure apparatus.

Thus, with the exposure apparatus 300 of this embodiment, the vibration cancellation apparatus VRU1 through VRU6 explained above are fixed in suitable positions upon structural members of the exposure apparatus 300 such as the columns 348 which are fixed upon the vibration cancellation table constituted by the VCMs 312A, 312B and 312C, the air mounts 314A, 314B, and 314C, and the base table 320 etc., or the lower base 325 or the base table 320 or the like.

And reactions are generated from each of the vibration cancellation apparatus VRU1 through VRU6 in the directions to quell the above-described vibrations in response to vibrations generated in structural members of the exposure apparatus 300. In this manner, it is possible further to enhance the vibration cancellation performance of the exposure apparatus 300 by incorporating the vibration cancellation apparatus in correspondence to locations in which undesired vibrations are generated in the exposure apparatus.

Although in the explanation of the above embodiment the use of a linear motor as the actuator used in the vibration cancellation apparatus is described by way of example, it is also possible to utilize a voice coil motor or a piezo actuator or the like, or some other type of actuator.

Further, with each of the above-described embodiments, explanation is made on the example of structure that causes relative movement between the vibration cancellation object and the weight, so that vibrations which are generated in the vibration cancellation object are reduced. However the present invention is not limited to this kind of structure. For example, it is also possible to arrange the structure so as to provide an actuator between a vibration cancellation object and a support pillar which is fixed upon a floor, and to drive this actuator based upon the previously described vibration signals and to impart force to the vibration cancellation object so as to reduce vibrations occurring in this vibration cancellation object. It is possible, for example, to use the structure disclosed in Japanese Patent Laying Open Publication Heisei 9-330857 as this type of structure. In this case, in order to integrate together the vibration cancellation apparatus as in the second embodiment, it is acceptable, for example, to arrange the structure so that the acceleration sensor which serves as a vibration sensor and the actuator are detachably fixed to the vibration cancellation object via the same support member. In this actuator, a movable element (a coil portion) may be supported by a support member, while a fixed element (a magnetic portion) is fixed to a member (a support pillar or a wall surface etc.) separate from the vibration cancellation object. With this structure, if the actuator is driven by flowing a prescribed electrical current through the above described coil based upon the above described vibration signal, it is possible to reduce the vibration of the vibration cancellation object by the resulting drive force.

Further, the above explained vibration cancellation apparatus can not only be equipped to an exposure apparatus, but to any device for which high vibration cancellation performance is required, such as a precision tool machine or a precision measuring device, or a charged particle beam exposure apparatus or an electron microscope or the like.

It should be noted that this embodiment, rather than being applied to an exposure apparatus which is a scanning type exposure apparatus, can also be applied to a step-and-repeat type exposure apparatus in which the mask and the substrate are left in a stationary state, a pattern on the mask is exposed, and the substrate is moved in successive steps.

Further, not only can this embodiment be applied to an exposure apparatus which uses a projection optical system, but also to a proximity exposure apparatus in which a mask and a substrate are brought closely together and the substrate is exposed with a pattern image through a mask.

Further, with regard to the application of the exposure apparatus, this is not limited to an exposure apparatus for manufacture of semiconductors; for example, a wider application is possible to an exposure apparatus for liquid crystal device which exposes a liquid crystal display element pattern onto a rectangular glass plate, or to an exposure apparatus for manufacturing thin film magnetic heads, or the like.

The light source of the exposure apparatus of this embodiment may not only be a gray beam (wavelength 436 nm), an i ray beam (wavelength 365 nm), a KrF excimer laser (wavelength 248 nm), an ArF excimer laser (wavelength 193 nm), or an F2 laser (157 nm), but may also be an X ray beam; or a charged particle beam such as an electron beam or the like can also be used. For example, in the case of employing an electron beam, it is possible to use thermal electron emission type lanthanum hexaborite (LaB6) or tantalum (Ta) for the electron gun.

Further, in the case of an exposure apparatus which uses an electron beam, it is possible to employ either a type which uses a mask, or a direct drawing type which uses no mask.

Yet further, the magnification ratio of the projection optical system of the exposure apparatus may not only be a reduction system, but may also be an equal ratio system or a magnification system.

Moreover, in connection with the projection optical system (including the incident optical system upon which the emitted beam is incident), if far ultraviolet rays such as an excimer laser or the like are employed, then materials which are transparent to far ultraviolet rays such as quartz or fluorite or the like should be used as the glass materials. While if an F2 laser or X rays are used then a cata-dioptric system or a refraction system should be used as the optical system (a reticle reflection type can also be used). Further, if an electron beam is used, an electronic optical system made up from an electronic lens and a deflector may desirably be used as the optical system. Of course, it goes without saying that the optical path (track) which the electron beam follows must be evacuated to the vacuum state.

If a linear motor (refer to U.S. Pat. No. 5,623,853 or U.S. Pat. No. 5,528,118) is used in the wafer stage or the reticle stage, either a floating air support using an air bearing or a floating magnetic support using Lorentz force or reactance force can desirably be used. Further, the stage may be of a type which moves along a guide, or may also be the guideless type in which no guide is provided.

As a drive device for the stage, a planar motor may be used which drives the stage by electromagnetic force, and in which a magnetic unit in which magnets are disposed in two dimensions is opposed to an armature unit in which coils are disposed in two dimensions. In this case, it will be acceptable to connect one of the magnetic unit and the armature unit to the stage, while providing the other one of the magnetic unit and the armature unit upon the moving surface side of the stage.

Reaction generated by the movement of the wafer stage, as disclosed in Japanese Patent Laying Open Publication Heisei 8-166475 (U.S. Pat No. 5,528,118), may be transmitted mechanically to the floor (the ground) by using a frame member.

Reaction generated by the movement of the reticle stage, as disclosed in Japanese Patent Laying Open Publication Heisei 8-330224 (U.S. Ser. No. 08/416,558), may be transmitted mechanically to the floor (the ground) by using a frame member.

The exposure apparatus according to an embodiment of the present invention is manufactured by assembling the various subsystems including each structural element specified in the patent claims of this application so as to maintain the specified mechanical accuracy, electrical accuracy, and optical accuracy. Before and after this assembly, adjustments for the various optical systems in order to attain optical accuracy, adjustments for the various mechanical systems in order to attain mechanical accuracy, and adjustments for the various electrical systems in order to attain electrical accuracy are performed in order to ensure these various accuracies. The process of assembling the various subsystems to the exposure apparatus includes establishing the mutual mechanical connections, electrical circuit cable connections, and conduit connections for the air pressure circuits, and so on of the various subsystems. It goes without saying that the individual assembly processes for the various subsystems come before the assembly process of the exposure apparatus with the subsystems. When the assembly process of the various subsystems to the exposure apparatus has been completed, mutual adjustments are performed, and various accuracies of the exposure apparatus as a whole are ensured. It should be noted that it is desirable to perform the manufacture of the exposure apparatus in a clean room in which the temperature and cleanliness and so on are controlled.

A semiconductor device is manufactured by the step of planning the function and performance of the device, the step of manufacturing a reticle based upon this planning step, the step of making a wafer from raw silicon, the step of exposing the wafer with the pattern on the reticle by an exposure apparatus according to an embodiment described above, the step of assembling the device (including a dicing process, a bonding process, and a packaging process), a testing step, and the like.

The present invention can be applied to a vibration cancellation table and an exposure apparatus which is capable of reducing vibration generated on a vibration cancellation table itself, or vibrations transmitted from outside bodies to the vibration cancellation table expels in vibration suppression capability. Further, it is possible to employ the present invention for an exposure apparatus which performs exposure using a charged particle beam, or for an optical bench such as an interferometer or the like which measures the planar accuracy of a body to be checked with high precision, or for a very high precision tool machine or the like.

What is claimed is:

1. A vibration cancellation apparatus comprising:
    a base member;
    a movable element which is set up upon said base member, and is movable upon said base member;
    a vibration proof unit that supports said base member above a foundation;
    a reaction transmission member which discharges reaction generated when said movable element moves upon said base member by transmitting the reaction to the foundation, the reaction transmission member being isolated from said base member by said vibration proof unit;
    a vibration detection device which detects vibration generated in said reaction transmission member;
    a weight which is movable in a direction to reduce the vibration, and which is provided to said reaction transmission member; and
    a vibration cancellation drive device which drives said weight so as to reduce the vibration based upon the vibration detected by said vibration detection device.

2. A vibration cancellation apparatus according to claim 1 further comprising:
    a position determination device that determines the position of said weight,
    wherein said vibration cancellation drive device performs control to drive said weight based upon a first control loop which controls said weight based upon a first signal outputted from said vibration detection device, and a second control loop which controls said weight based upon a second signal outputted from said position determination device.

3. A vibration cancellation apparatus according to claim 2 further comprising:
    a control device which controls said vibration cancellation drive device based upon said first control loop and said second control loop,
    wherein said control device comprises a first filter device which reduces intensity of said first signal with respect to a frequency component outside a first predetermined band, and a second filter device which reduces intensity of said second signal with respect to a frequency component outside a second predetermined band.

4. vibration cancellation apparatus comprising:
    a vibration detection device which is provided to a vibration cancellation object, and which outputs a vibration signal according to the magnitude of vibration generated in said vibration cancellation object;
    a weight which is provided so as to be capable of relative movement with respect to said vibration cancellation object;
    a drive device which generates relative movement between said weight and said vibration cancellation object; and
    a position determination device which determines the position of said weight and outputs a position signal according to the position of said weight; wherein
        said drive device performs control based upon a first control loop which controls the drive speed of said weight based upon said vibration signal, and a second control loop which moves said weight to a specified position based upon the position information.

5. A vibration cancellation apparatus according to claim 4 further comprising:
    a control device which controls said drive device based upon said first control loop and said second control loop; wherein
        said control device comprises a first filter device which reduces intensity of said vibration signal with respect to a frequency component outside a predetermined band, and a second filter device which reduces intensity of said position signal with respect to a frequency component outside a predetermined band, and wherein said drive device is controlled so as to reduce the vibration by performing said first control loop based upon said vibration signal which has been filtered by said first filter device, and by performing said second control loop based upon said position signal which has been filtered by said second filter device.

6. A vibration cancellation apparatus according to claim 4 wherein:

said second control loop sets the drive speed of said weight so as not to generate new vibration in said vibration cancellation object when said drive device is driving said weight base d upon said second control loop.

7. A vibration cancellation apparatus according to claim 4 wherein:

the mass of said weight is adjustable.

8. A vibration cancellation apparatus according to claim 4 wherein:

said drive device is a linear motor.

9. A vibration cancellation apparatus according to claim 8 wherein:

in said linear motor a coil is disposed in a fixed section side, while a moving magnet and said weight are disposed in a movable section side.

10. A vibration cancellation apparatus comprising:

a first vibration detection device which is provided to a vibration cancellation object, and which outputs a first vibration signal according to the magnitude of vibration generated in said vibration cancellation object;

a weight which is provided so as to be capable of relative movement with respect to said vibration cancellation object;

a second vibration detection device which is provided to said weight, and which outputs a second vibration signal according to the magnitude of vibration generated in said weight; and a drive device which generates drive force which causes relative movement between said weight and said vibration cancellation object; wherein said drive device performs control based upon said first vibration signal and said second vibration signal.

11. A vibration cancellation apparatus according to claim 10 further comprising a resilient member which is connected in parallel equivalently to said drive device between said vibration cancellation object and said weight.

12. A vibration cancellation apparatus according to claim 10 wherein:

the mass of said weight is adjustable.

13. A vibration cancellation apparatus according to claim 10 wherein:

said drive device is a linear motor.

14. A vibration cancellation apparatus according to claim 13 wherein:

in said linear motor, a coil is disposed in a fixed section side, while a moving magnet and said weight are disposed in a movable section side.

15. A vibration cancellation apparatus for reducing vibration generated in a vibration cancellation object comprising:

a vibration detection device which outputs a vibration signal according to the magnitude of vibration generated in said vibration cancellation object;

a drive device which generates a drive force to reduce the vibration based upon said vibration signal;

a support member which supports said vibration detection device and said drive device; and a fixing device which fixes said support member to said vibration cancellation object in a removable manner; and a weight which is provided so as to be capable of relative movement with respect to said vibration cancellation object, the mass of said weight being adjustable.

16. A vibration cancellation apparatus according to claim 15 wherein:

said support member is a casing member which houses said vibration detection device and said drive device in its interior.

17. A vibration cancellation apparatus according to claim 15 wherein:

said drive device generates relative movement between said weight and said vibration cancellation object by said drive force.

18. A vibration cancellation apparatus according to claim 17 further comprising:

a position detection device which detects the position of said weight and outputs a position signal according to the position of said weight, wherein said drive device performs control based upon a first control loop which controls the drive speed of said weight based upon said vibration signal, and a second control loop which moves said weight to a predetermined position based upon the position information.

19. A vibration cancellation apparatus according to claim 18 further comprising a control device which controls said drive device based upon said first control loop and said second control loop; wherein said control device comprises a first filter device which reduces intensity of said vibration signal with respect to a frequency component outside a predetermined band and, a second filter device which reduces intensity of said position signal with respect to a frequency component outside a predetermined band; and said drive device is controlled so as to reduce the vibration by performing said first control loop based upon said vibration signal which has been filtered by said first filter device, and by performing said second control loop based upon said position signal which has been filtered by said second filter device.

20. A vibration cancellation apparatus according to claim 18 wherein:

said second control loop sets the drive speed of said weight so as not to generate new vibration in said vibration cancellation object when said drive device is driving said weight based upon said second control loop.

21. A vibration cancellation apparatus according to claim 17 wherein said drive device comprises:

a linear motor including a coil and a moving magnet, wherein said coil is disposed in a fixed section side, while said moving magnet and said weight are disposed in a movable section side.

22. A vibration cancellation apparatus according to claim 15 wherein:

said drive device is a linear motor.

23. A vibration cancellation apparatus for reducing vibration generated in a vibration cancellation object comprising:

a vibration detection device which outputs a vibration signal according to the magnitude of vibration generated in said vibration cancellation object;

a drive device which generates a drive force to reduce the vibration based upon said vibration signal;

a support member which supports said vibration detection device and said drive device;

a fixing device which fixes said support member to said vibration cancellation object in a removal manner;

a weight which is provided so as to be capable of relative movement with respect to said vibration cancellation object; and a position detection device which detects the position of said weight and outputs a position signal according to the position of said weight, wherein said drive device performs control based upon a first control loop which controls the drive speed of said weight based upon said vibration signal, and a second control loop which moves said weight to a predetermined position based upon the position information.

24. A vibration cancellation apparatus according to claim 23 further comprising:

a control device which controls said drive device based upon said first control loop and said second control loop, wherein:

said control device comprises a first filter device which reduces intensity of said vibration signal with respect to a frequency component outside a predetermined band and, a second filter device which reduces intensity of said position signal with respect to a frequency component outside a predetermined band; and said drive device is controlled so as to reduce the vibration by performing said first control loop based upon said vibration signal which has been filtered by said first filter device, and by performing said second control loop based upon said position signal which has been filtered by said second filter device.

25. A vibration cancellation apparatus according to claim 23 wherein:

said second control loop sets the drive speed of said weight so as not to generate new vibration in said vibration cancellation object when said drive device is driving said weight based upon said second control loop.

* * * * *